United States Patent
Nakamura et al.

(10) Patent No.: US 10,497,561 B2
(45) Date of Patent: * Dec. 3, 2019

(54) METHOD FOR MANUFACTURING SEMICONDUCTOR DEVICE, SUBSTRATE-PROCESSING APPARATUS, AND RECORDING MEDIUM

(71) Applicant: KOKUSAI ELECTRIC CORPORATION, Tokyo (JP)

(72) Inventors: Yoshinobu Nakamura, Toyama (JP); Kiyohiko Maeda, Toyama (JP); Yoshiro Hirose, Toyama (JP); Ryota Horiike, Toyama (JP); Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/270,099

(22) Filed: Feb. 7, 2019

(65) Prior Publication Data

US 2019/0189422 A1 Jun. 20, 2019

Related U.S. Application Data

(63) Continuation of application No. 15/950,879, filed on Apr. 11, 2018, now Pat. No. 10,229,829, which is a (Continued)

(30) Foreign Application Priority Data

Jun. 25, 2014 (JP) .................................. 2014-130267

(51) Int. Cl.
*H01L 21/02* (2006.01)
*C23C 16/02* (2006.01)
(Continued)

(52) U.S. Cl.
CPC .......... *H01L 21/0228* (2013.01); *C23C 16/02* (2013.01); *C23C 16/34* (2013.01);
(Continued)

(58) Field of Classification Search
CPC ......... H01L 21/76831; H01L 21/76843; H01L 21/02057; H01L 21/30655;
(Continued)

(56) References Cited

U.S. PATENT DOCUMENTS 6,429,518 B1  8/2002  Endo
8,080,290 B2  12/2011 Hasebe et al.
(Continued)

FOREIGN PATENT DOCUMENTS

JP  2000-114252 A  4/2000
JP  2003-204060 A  7/2003
(Continued)

OTHER PUBLICATIONS

International Search Report, PCT/JP2015/068132, dated Oct. 6, 2015, 2 pgs. *Cited in parent application.
(Continued)

*Primary Examiner* — Jeffrie R Lund
(74) *Attorney, Agent, or Firm* — Volpe and Koenig, P.C.

(57) ABSTRACT

There is provided a method for manufacturing a semiconductor device, including: providing a substrate with an oxide film formed on a surface thereof; pre-processing a surface of the oxide film; and forming a nitride film containing carbon on the surface of the oxide film which has been pre-processed, by performing a cycle a predetermined number of times, the cycle including non-simultaneously performing: supplying a precursor gas to the substrate; supplying a carbon-containing gas to the substrate; and supplying a nitrogen-containing gas to the substrate, or by performing a cycle a predetermined number of times, the cycle including
(Continued)

non-simultaneously performing: supplying a precursor gas to the substrate; and supplying a gas containing carbon and nitrogen to the substrate, or by performing a cycle a predetermined number of times, the cycle including non-simultaneously performing: supplying a precursor gas containing carbon to the substrate; and supplying a nitrogen-containing gas to the substrate.

15 Claims, 16 Drawing Sheets

Related U.S. Application Data continuation of application No. 15/386,859, filed on Dec. 21, 2016, now Pat. No. 10,163,625, which is a continuation of application No. PCT/JP2015/068132, filed on Jun. 24, 2015.

(51) Int. Cl.
    *C23C 16/34* (2006.01)
    *C23C 16/455* (2006.01)
    *C23C 16/56* (2006.01)
    *C23C 16/52* (2006.01)
    *H01L 21/306* (2006.01)
    *H01L 21/308* (2006.01)

(52) U.S. Cl.
    CPC .... *C23C 16/4554* (2013.01); *C23C 16/45527* (2013.01); *C23C 16/45542* (2013.01); *C23C 16/45544* (2013.01); *C23C 16/52* (2013.01); *C23C 16/56* (2013.01); *H01L 21/0217* (2013.01); *H01L 21/0234* (2013.01); *H01L 21/02126* (2013.01); *H01L 21/02211* (2013.01); *H01L 21/02247* (2013.01); *H01L 21/02274* (2013.01); *H01L 21/02304* (2013.01); *H01L 21/02312* (2013.01); *H01L 21/02315* (2013.01); *H01L 21/02318* (2013.01); *H01L 21/02337* (2013.01); *H01L 21/3081* (2013.01); *H01L 21/3086* (2013.01); *H01L 21/30604* (2013.01)

(58) Field of Classification Search
    CPC ......... H01L 21/31055; H01L 21/31111; H01L 21/31133; H01L 21/32133; H01L 39/247; H01L 21/76205; H01L 21/76224; H01L 21/20; H01L 21/203; H01L 21/28061; H01L 21/28194; H01L 21/28229; H01L 21/283; H01L 2221/1031; H01L 2224/02317; H01L 2224/033; H01L 2224/034; H01L 2224/03426; H01L 2224/0345; H01L 2224/03452; H01L 2224/03466; H01L 2224/03824; H01L 2224/03826; H01L 2224/03827; H01L 21/02315; H01L 21/0234; H01L 21/3065; H01L 21/32136; H01L 21/0228; H01L 21/02318; H01L 21/02304; H01L 21/02211; H01L 21/02126; H01L 21/02247; H01L 21/3081; H01L 21/0217; H01L 21/02274; H01L 21/30604; H01L 21/02312; H01L 21/3086; H01L 21/02337; C23C 16/45527; C23C 16/56; C23C 16/45542; C23C 16/4554; C23C 16/45544; C23C 16/52; C23C 16/02; C23C 16/34

See application file for complete search history.

(56) References Cited

U.S. PATENT DOCUMENTS

| | | | |
|---|---|---|---|
| 8,815,751 B2 | 8/2014 | Hirose et al. | |
| 9,165,761 B2 | 10/2015 | Hirose et al. | |
| 9,330,904 B2 | 5/2016 | Takasawa et al. | |
| 9,334,567 B2 | 5/2016 | Hirose et al. | |
| 9,620,357 B2 | 4/2017 | Hashimoto | |
| 10,163,625 B2 * | 12/2018 | Nakamura | C23C 16/02 |
| 10,229,829 B2 * | 3/2019 | Nakamura | C23C 16/02 |
| 2007/0238316 A1 | 10/2007 | Ohashi | |
| 2008/0032509 A1 | 2/2008 | Ohashi et al. | |
| 2009/0191722 A1 | 7/2009 | Hasebe et al. | |
| 2010/0130024 A1 | 5/2010 | Takasawa et al. | |
| 2010/0239781 A1 | 9/2010 | Sano | |
| 2012/0184110 A1 | 7/2012 | Hirose | |
| 2012/0282418 A1 | 11/2012 | Chou et al. | |
| 2013/0032888 A1 | 2/2013 | Murata | |
| 2013/0052836 A1 | 2/2013 | Hirose et al. | |
| 2013/0149872 A1 | 6/2013 | Hirose et al. | |
| 2013/0220410 A1 * | 8/2013 | Haas | H01L 31/02167 136/256 |
| 2014/0213067 A1 | 7/2014 | Murakami et al. | |
| 2014/0225263 A1 | 8/2014 | Nemoto et al. | |
| 2014/0349492 A1 | 11/2014 | Shimamoto et al. | |
| 2017/0025271 A1 | 1/2017 | Hashimoto et al. | |
| 2017/0103885 A1 | 4/2017 | Nakamura et al. | |
| 2018/0061636 A1 | 3/2018 | Li et al. | |
| 2018/0122631 A1 | 5/2018 | Xiao et al. | |
| 2018/0151346 A1 | 5/2018 | Blanquart | |
| 2018/0233351 A1 | 8/2018 | Nakamura et al. | |
| 2019/0189422 A1 * | 6/2019 | Nakamura | C23C 16/02 |

FOREIGN PATENT DOCUMENTS

| | | |
|---|---|---|
| JP | 2007-067324 A | 3/2007 |
| JP | 2007-194239 A | 8/2007 |
| JP | 2007-281181 A | 10/2007 |
| JP | 2008-041934 A | 2/2008 |
| JP | 2008-182001 A | 8/2008 |
| JP | 2008-227460 A | 9/2008 |
| JP | 2009-170823 A | 7/2009 |
| JP | 2009-0170823 A | 7/2009 |
| JP | 2013-140946 A | 7/2013 |
| JP | 2014-013928 A | 1/2014 |
| JP | 2014-030041 A | 2/2014 |
| JP | 2014-30041 A | 2/2014 |
| WO | 2013-027549 A1 | 2/2013 |

OTHER PUBLICATIONS

Japanese Office Action for Application No. 2016-529619 dated May 25, 2017 *Cited in parent application.
Korean Office Action dated Mar. 9, 2018 for Korean Patent Application No. 10-2016-7035779 *Cited in parent application.
Japanese Office Action dated Jul. 3, 2017 for the JP Pat. Appln. No. 2016-529619 *Cited in parent application.

* cited by examiner

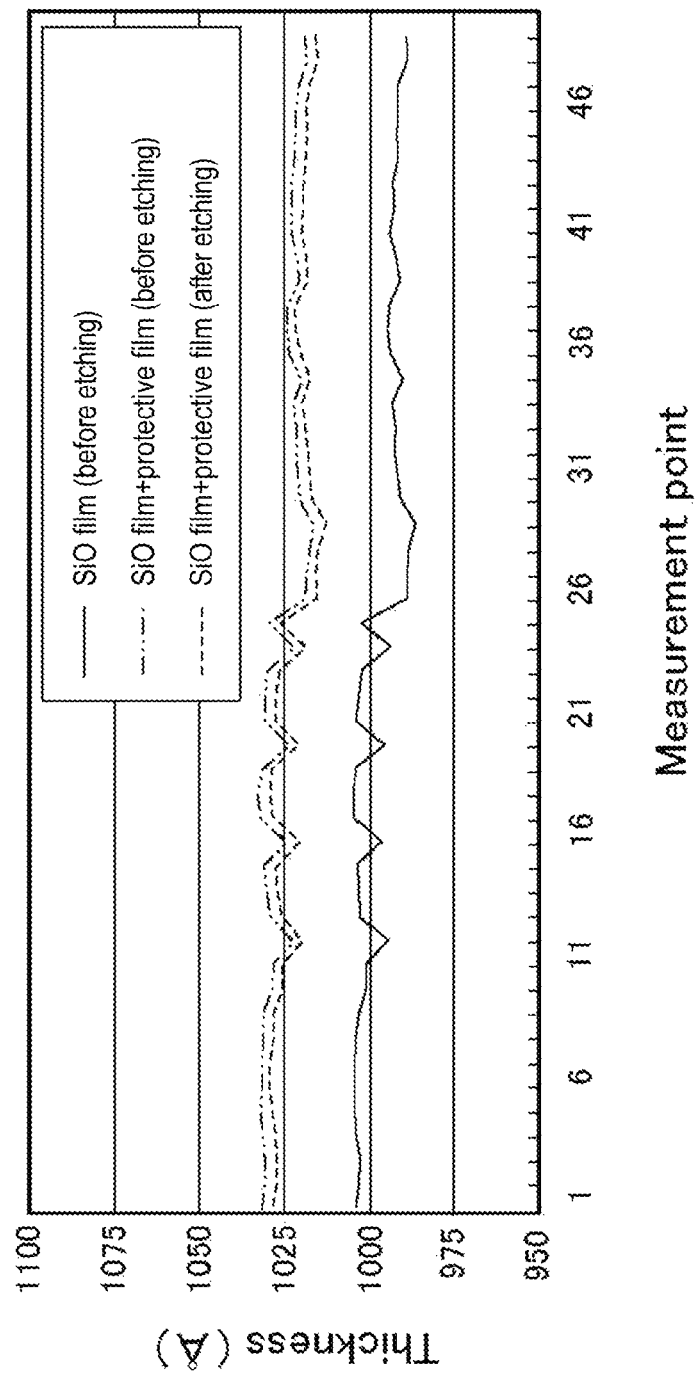

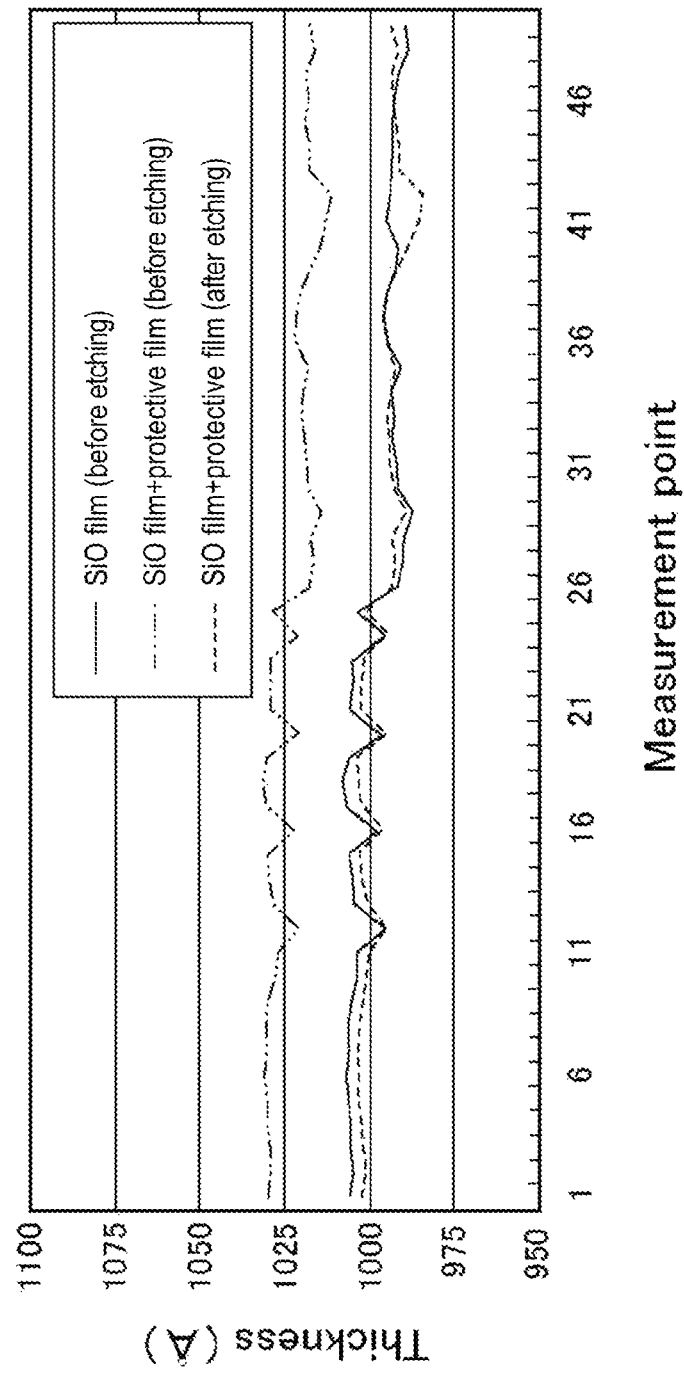

METHOD FOR MANUFACTURING SEMICONDUCTOR DEVICE, SUBSTRATE-PROCESSING APPARATUS, AND RECORDING MEDIUM

CROSS-REFERENCE TO RELATED APPLICATION

This application is a Continuation of U.S. patent application Ser. No. 15/950,879 filed on Apr. 11, 2018 which is a continuation of U.S. patent application Ser. No. 15/386,859, filed on Dec. 21, 2016, which issued on Dec. 25, 2018 as U.S. Pat. No. 10,163,625, which is a Continuation Application of PCT International Application No. PCT/JP2015/068132, filed Jun. 24, 2015, which claimed the benefit of Japanese Patent Application No. 2014-130267, filed Jun. 25, 2014, the entire contents of which are incorporated herein by reference in its entirety.

TECHNICAL FIELD

The present disclosure relates to a method for manufacturing a semiconductor device, a substrate-processing apparatus, and a non-transitory computer-readable recording medium.

BACKGROUND

As one process for manufacturing a semiconductor device, a process of forming a nitride film, such as a silicon nitride film ($Si_3N_4$ film, hereinafter, also referred to as an SiN film) or the like as a protective film on a substrate on which an oxide film such as a silicon oxide film ($SiO_2$ film, hereinafter, also referred to as an SiO film) or the like is formed, is often performed. When an etching process is performed on the substrate, the oxide film can be protected by the nitride film formed on the oxide film.

However, if a film thickness of the nitride film is thin, the function of the nitride film as the protective film may be lowered. As a result, when an etching process is performed on the substrate, the oxide film may be damaged. The present disclosure provides some embodiments of a technique capable of suppressing a degradation of a function of a nitride film as a protective film.

SUMMARY

According to one embodiment of the present disclosure, there is provided a technology which includes: providing a substrate with an oxide film formed on a surface thereof; pre-processing a surface of the oxide film; and forming a nitride film containing carbon on the surface of the oxide film which has been pre-processed, by performing a cycle a predetermined number of times, the cycle including non-simultaneously performing: supplying a precursor gas to the substrate; supplying a carbon-containing gas to the substrate; and supplying a nitrogen-containing gas to the substrate, or by performing a cycle a predetermined number of times, the cycle including non-simultaneously performing: supplying a precursor gas to the substrate; and supplying a gas containing carbon and nitrogen to the substrate, or by performing a cycle a predetermined number of times, the cycle including non-simultaneously performing: supplying a precursor gas containing carbon to the substrate; and supplying a nitrogen-containing gas to the substrate.

According to some embodiments of the present disclosure, it is possible to suppress a degradation of a function of a nitride film as a protective film.

BRIEF DESCRIPTION OF THE DRAWINGS

FIG. 14A is a view illustrating an evaluation result of etching tolerance in an Example, and FIG. 14B is a view illustrating an evaluation result of etching tolerance in a Comparative example.

DETAILED DESCRIPTION

First Embodiment

A first embodiment of the present disclosure will be now described mainly with reference to FIGS. 1 to 4.

(1) Configuration of Substrate-Processing Apparatus

Figure 1:
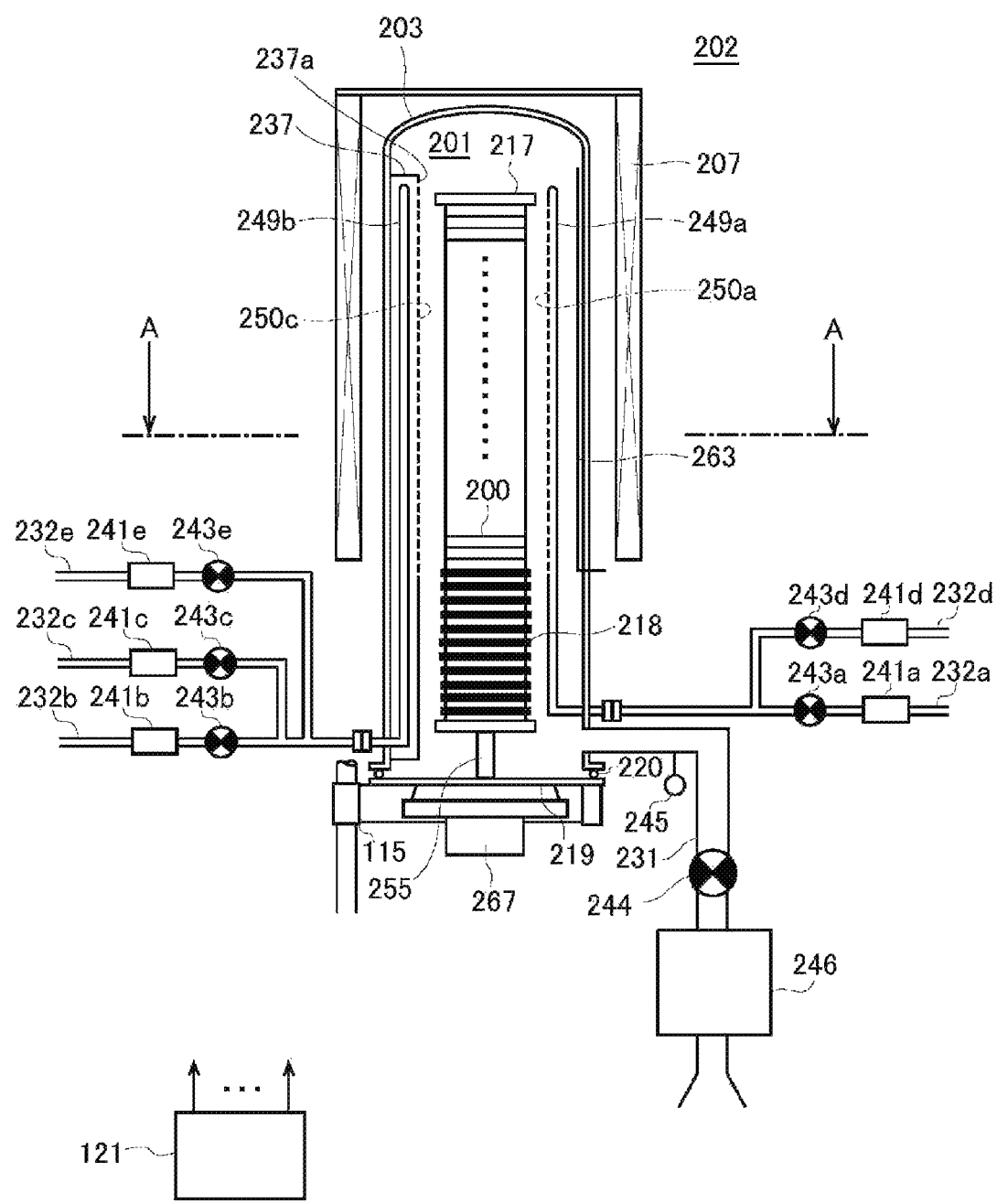
FIG. 1 is a schematic configuration diagram of a vertical type process furnace of a substrate-processing apparatus suitably used in an embodiment of the present disclosure, in which a portion of the process furnace is shown in a vertical cross sectional view.

First, a configuration of a substrate-processing apparatus as a first substrate processing part will be described with reference to FIGS. 1 to 3. As illustrated in FIG. 1, a process furnace 202 includes a heater 207 as a heating mechanism (temperature adjustment part). The heater 207 has a cylindrical shape and is supported by a heater base (not shown) serving as a holding plate so as to be vertically installed. The heater 207 functions as an activation mechanism (an excitation part) configured to activate (excite) a gas with heat, as will be described later.

A reaction tube 203 constituting a reaction vessel (process vessel) is disposed inside the heater 207 in a concentric form along the heater 207. The reaction tube 203 is made of, for example, a heat resistant material such as quartz ($SiO_2$), silicon carbide (SiC) or the like and has a cylindrical shape with its upper end closed and its lower end opened. A process chamber (first process chamber) 201 is formed in a cylindrical hollow of the reaction tube 203. The process chamber 201 is configured to accommodate wafers 200 as substrates. The wafers 200 are horizontally stacked in multiple stages to be arranged in a vertical direction inside a boat 217 which will be described later.

Nozzles 249a and 249b are installed in the process chamber 201 so as to penetrate through a lower portion of the reaction tube 203. The nozzles 249a and 249b are made of, for example, a heat resistant material such as quartz, SiC or the like. Gas supply pipes 232a and 232b are respectively connected to the nozzles 249a and 249b. A gas supply pipe 232c is connected to the gas supply pipe 232b. In this way, the two nozzles 249a and 249b and the three gas supply pipes 232a to 232c are installed in the reaction tube 203 such that plural kinds of gases are supplied into the process chamber 201.

However, the process furnace 202 of the present embodiment is not limited to the aforementioned configuration. For example, a manifold made of metal and configured to support the reaction tube 203 may be installed below the reaction tube 203. Each of the nozzles may be installed to penetrate through a sidewall of the manifold. In this case, an exhaust pipe 231 to be described later may be further installed in the manifold. Even in this case, the exhaust pipe 231 may be installed below the reaction tube 203, rather than in the manifold. In this manner, a furnace opening portion of the process furnace 202 may be made of metal and the nozzles or the like may be attached to the metal furnace opening portion.

Mass flow controllers (MFCs) 241a to 241c as flow rate controllers (flow rate control parts), and valves 243a to 243c as opening/closing valves, are sequentially installed in the gas supply pipes 232a to 232c from the respective upstream sides, respectively. Gas supply pipes 232d and 232e, which supply an inert gas, are respectively connected to the gas supply pipes 232a and 232b at the downstream sides of the valves 243a and 243b. MFCs 241d and 241e as flow rate controllers (flow rate control parts), and valves 243d and 243e as opening/closing valves, are respectively installed in the gas supply pipes 232d and 232e sequentially from the respective upstream sides.

The nozzle 249a is connected to a front end portion of the gas supply pipe 232a. As illustrated in FIG. 2, the nozzle 249a is disposed in a circular ring-shaped space in a plan view between the inner wall of the reaction tube 203 and the wafers 200 such that the nozzle 249a is installed to extend upward along a stacking direction of the wafers 200 from a lower portion of the inner wall of the reaction tube 203 to an upper portion of the inner wall of the reaction tube 203. Specifically, the nozzle 249a is installed at a lateral side of a wafer arrangement region in which the wafers 200 are arranged, namely in a region which horizontally surrounds the wafer arrangement region, so as to extend along the wafer arrangement region. That is to say, the nozzle 249a is installed in a perpendicular relationship with the surfaces (flat surfaces) of the wafers 200 at a lateral side of the end portions (peripheral edge portions) of the wafers 200 which are carried into the process chamber 201. The nozzle 249a is configured as an L-shaped long nozzle. A horizontal portion of the nozzle 249a is installed to penetrate through a sidewall of a lower portion of the reaction tube 203. A vertical portion of the nozzle 249a is installed to extend upward at least from one end portion of the wafer arrangement region toward the other end portion of the wafer arrangement region. Gas supply holes 250a through which gas is supplied are formed on the side surface of the nozzle 249a. The gas supply holes 250a are opened toward the center of the reaction tube 203 so as to allow a gas to be supplied toward the wafers 200. The gas supply holes 250a may be formed to span from the lower portion to the upper portion of the reaction tube 203. The respective gas supply holes 250a may have the same opening area and may be formed at the same opening pitch.

The nozzle 249b is connected to a front end portion of the gas supply pipe 232b. The nozzle 249b is installed within a buffer chamber 237 which is a gas diffusion space. The buffer chamber 237 is formed between the inner wall of the reaction tube 203 and a partition wall 237a. As illustrated in FIG. 2, the buffer chamber 237 (the partition wall 237a) is installed in a circular ring-shaped space in a plan view between the inner wall of the reaction tube 203 and the wafers 200 such that the buffer chamber 237 (the partition wall 237a) extends along the stacking direction of the wafers 200 from the lower portion of the inner wall of the reaction tube 203 to the upper portion of the inner wall of the reaction tube 203. That is to say, the buffer chamber 237 (the partition wall 237a) is installed at the lateral side of the wafer arrangement region, namely in the region which horizontally surrounds the wafer arrangement region, so as to extend along the wafer arrangement region. Gas supply holes 250c through which gas is supplied are formed in an end portion of the surface of the partition wall 237a which faces (adjoins) the wafers 200. The gas supply holes 250c are opened toward the center of the reaction tube 203 such that gas is supplied toward the wafers 200. The gas supply holes 250c may be formed to span from the lower portion to the upper portion of the reaction tube 203. The gas supply holes 250c may have the same opening area and may be formed at the same opening pitch.

The nozzle 249b is installed in an end portion of the buffer chamber 237 opposite to the end portion of the buffer chamber 237 having the gas supply holes 250c such that the nozzle 249b extends upward along the stacking direction of the wafers 200 from the lower portion of the inner wall of the reaction tube 203 to the upper portion of the inner wall of the reaction tube 203. Specifically, the nozzle 249b is installed at the lateral side of the wafer arrangement region in which the wafers 200 are arranged, namely in the region which horizontally surrounds the wafer arrangement region, so as to extend along the wafer arrangement region. That is to say, the nozzle 249b is installed in a perpendicular relationship with the surfaces of the wafers 200 at the lateral side of the end portions of the wafers 200 which are carried into the process chamber 201. The nozzle 249b is configured as an L-shaped long nozzle. A horizontal portion of the nozzle 249b is installed to penetrate through the sidewall of the lower portion of the manifold 209. A vertical portion of the nozzle 249b is installed to extend upward at least from one end portion of the wafer arrangement region toward the other end portion of the wafer arrangement region. Gas supply holes 250b through which gas is supplied are formed in the side surface of the nozzle 249b. The gas supply holes 250b are opened toward the center of the buffer chamber 237. Similar to the gas supply holes 250c, the gas supply holes 250b may be formed to span from the lower portion to the upper portion of the reaction tube 203. In the case where a differential pressure between the interior of the buffer chamber 237 and the interior of the process chamber 201 is small, the opening area and the opening pitch of the gas supply holes 250b may be respectively set to remain constant between the upstream side (lower portion) and the downstream side (upper portion) of the nozzle 249b. In the case where the differential pressure between the interior of the buffer chamber 237 and the interior of the process chamber 201 is large, the opening area of the gas supply holes 250b may be set to become gradually larger from the upstream side toward the downstream side of the nozzle 249b, or the opening pitch of the gas supply holes 250b may be set to become gradually smaller from the upstream side toward the downstream side of the nozzle 249b.

By adjusting the opening area or the opening pitch of each of the gas supply holes 250b between the upstream side and the downstream side as mentioned above, it is possible to inject a gas from the gas supply holes 250b at different flow velocities but at a substantially equal flow rate. The gas injected from the respective gas supply holes 250b is first introduced into the buffer chamber 237. This makes it possible to equalize the flow velocities of the gas within the buffer chamber 237. The gas injected from the respective gas supply holes 250b into the buffer chamber 237 is injected from the gas supply holes 250c into the process chamber 201 after the particle velocity of the gas is relaxed within the buffer chamber 237. The gas injected from the respective gas supply holes 250b into the buffer chamber 237 has a uniform flow rate and a uniform flow velocity when injected from the respective gas supply holes 250c into the process chamber 201.

As described above, in the present embodiment, a gas is transferred through the nozzles 249a and 249b and the buffer chamber 237, which are disposed in a lengthwise long space of a circular ring shape in a plan view, i.e., a cylindrical space, defined by the inner wall of the side wall of the reaction tube 203 and the end portions (peripheral edge portions) of the wafers 200 carried into the reaction tube 203. The gas is initially injected into the reaction tube 203, near the wafers 200, through the gas supply holes 250a to 250c formed in the nozzles 249a and 249b and the buffer chamber 237. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the film thickness uniformity of a film formed on each of the wafers 200. In addition, the gas flowing on the surfaces of the wafers 200, i.e., the residual gas after reaction, flows toward an exhaust port, i.e., the exhaust pipe 231 which will be described later. However, the flow direction of the residual gas is not limited to a vertical direction but may be appropriately decided depending on a position of the exhaust port.

A precursor gas containing a predetermined element, for example, a halosilane precursor gas which contains silicon (Si) as a predetermined element and a halogen element, is supplied from the gas supply pipe 232a into the process chamber 201 through the MFC 241a, the valve 243a, and the nozzle 249a.

The halosilane precursor gas refers to a gaseous halosilane precursor, for example, a gas obtained by vaporizing a halosilane precursor which remains in a liquid state under room temperature and atmospheric pressure, or a halosilane precursor which remains in a gaseous state under room temperature and atmospheric pressure. The halosilane precursor refers to a silane precursor having a halogen group. The halogen group includes a chloro group, a fluoro group, a bromo group, an iodine group, and the like. That is to say, the halogen group includes a halogen element such as chlorine (Cl), fluorine (F), bromine (Br), iodine (I) or the like. The halosilane precursor may refer to one kind of halogenide. When the term "precursor" is used herein, it may refer to "a liquid precursor staying in a liquid state," "a precursor gas staying in a gaseous state", or both.

As the halosilane precursor gas, it may be possible to use a precursor gas which contains, for example, Si and Cl, i.e., a chlorosilane precursor gas. The chlorosilane precursor gas acts as a silicon source (Si source) in a film forming process which will be described later. As the chlorosilane precursor gas, it may be possible to use, for example, a dichlorosilane ($SiH_2Cl_2$, abbreviation: DCS) gas.

A reaction gas which has a chemical structure (molecular structure) different from that of a precursor gas, for example, a nitrogen (N)-containing gas, is supplied from the gas supply pipe 232b into the process chamber 201 through the MFC 241b, the valve 243b, the nozzle 249b, and the buffer chamber 237. As the N-containing gas, it may be possible to use, for example, a hydrogen nitride-based gas. The hydrogen nitride-based gas may be a substance consisting of only two elements N and H, and acts as a nitriding gas, i.e., a nitrogen source (N source), in the film forming process which will be described later. As the hydrogen nitride-based gas, it may be possible to use, for example, an ammonia ($NH_3$) gas.

A reaction gas which has a chemical structure different from that of a precursor gas, for example, a carbon (C)-containing gas, is supplied from the gas supply pipe 232c into the process chamber 201 through the MFC 241c, the valve 243c, the gas supply pipe 232b, the nozzle 249b, and the buffer chamber 237. As the C-containing gas, it may be possible to use, for example, a hydrocarbon-based gas. The hydrocarbon-based gas may be a substance consisting of only two elements C and H, and acts as a carbon source (C source), in the film forming process which will be described later. As the hydrocarbon-based gas, it may be possible to use, for example, a propylene ($C_3H_6$) gas.

A modification gas is supplied from the gas supply pipes 232a and 232b into the process chamber 201 through the MFCs 241a and 241b, the valves 243a and 243b, the nozzles 249a and 249b, and the buffer chamber 237.

As the modification gas, it may be possible to use an N-containing gas in a plasma-excited state. As the N-containing gas, it may be possible to use, for example, at least one gas selected from a group consisting of an $NH_3$ gas, a diagen ($N_2H_2$) gas, a hydrazine ($N_2H_4$) gas, and an $N_3H_8$ gas.

Further, as the modification gas, it may be possible to use an inert gas in a plasma-excited state. As the inert gas, it may be possible to use at least one gas selected from a group consisting of a nitrogen ($N_2$) gas and a rare gas. As the rare gas, it may be possible to use at least one gas selected from a group consisting of an argon (Ar) gas, a helium (He) gas, a neon (Ne) gas and a xenon (Xe) gas.

Also, as the modification gas, it may be possible to use a hydrogen (H)-containing gas in a plasma-excited state. As the H-containing gas, it may be possible to use, for example, at least one gas selected from a group consisting of a hydrogen ($H_2$) gas and a heavy hydrogen ($D_2$) gas.

In addition, as the modification gas, it may be possible to use an oxygen (O)-containing gas in a plasma-excited state. As the O-containing gas, it may be possible to use, for example, an oxygen ($O_2$) gas. Also, as the modification gas, it may be possible to use, for example, an ozone ($O_3$) gas, an $O_2$ gas, or an $H_2$ gas ($O_2+H_z$ gas) which stays in a non-plasma-excited state.

An inert gas, for example, an $N_2$ gas, is supplied from the gas supply pipes 232d and 232e into the process chamber 201 via the MFCs 241d and 241e, the valves 243d and 243e, the gas supply pipes 232a and 232b, the nozzles 249a and 249b, and the buffer chamber 237.

A precursor gas supply system (first supply system) is mainly configured by the gas supply pipe 232a, the MFC 241a, and the valve 243a. The nozzle 249a may be regarded as being included in the precursor gas supply system. The precursor gas supply system may be referred to as a precursor supply system. In the case where the halosilane precursor gas is supplied from the gas supply pipe 232a, the precursor gas supply system may be referred to as a halosilane precursor gas supply system or a halosilane precursor supply system.

Further, an N-containing gas supply system (second supply system) is mainly configured by the gas supply pipe 232b, the MFC 241b, and the valve 243b. The nozzle 249b and the buffer chamber 237 may be regarded as being included in the N-containing gas supply system. The N-containing gas supply system may be referred to as a nitriding gas supply system or a nitriding agent supply system. In the case where a hydrogen nitride-based gas is supplied from the gas supply pipe 232b, the N-containing gas supply system may be referred to as a hydrogen nitride-based gas supply system or a hydrogen nitride supply system.

Furthermore, a C-containing gas supply system (third supply system) is mainly configured by the gas supply pipe 232c, the MFC 241c, and the valve 243c. The nozzle 249b and the buffer chamber 237, which exist at the downstream side of a connection portion where the gas supply pipe 232b is connected to the gas supply pipe 232c, may be regarded as being included in the C-containing gas supply system. In the case where the hydrocarbon-based gas is supplied from the gas supply pipe 232c, the C-containing gas supply system may be referred to as a hydrocarbon-based gas supply system or a hydrocarbon supply system.

Further, in the case where the aforementioned modification gas is supplied from the gas supply pipes 232a and 232b, the gas supply system configured by the gas supply pipe 232a, the MFC 241a, and the valve 243a or the gas supply system configured by the gas supply pipe 232b, the MFC 241b, and the valve 243b may be referred to as a modification gas supply system (fourth supply system). The nozzles 249a and 249b and the buffer chamber 237 may be regarded as being included in the modification gas supply system.

One or both of the N-containing gas supply systems and the C-containing gas supply system as described above may be referred to as a reaction gas supply system. Further, one or all of the precursor gas, the reaction gas, and the modification gas as described above may be referred to as a process gas. Moreover, one or all of the precursor gas supply system, the reaction gas supply system, and the modification gas supply system may be referred to as a process gas supply system and may be simply referred to as a supply system.

Further, an inert gas supply system is mainly configured by the gas supply pipes 232d and 232e, the MFCs 241d and 241e, the valves 243d and 243e. The inert gas supply system may be referred to as a purge gas supply system or a carrier gas supply system.

Figure 2:
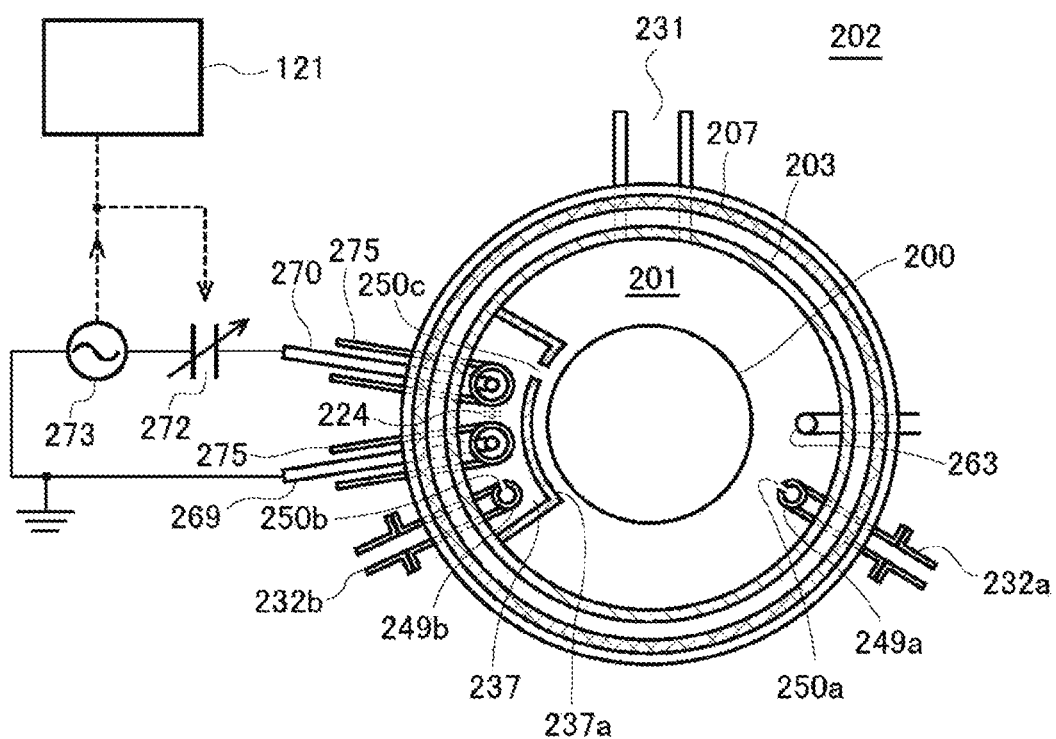
FIG. 2 is a schematic configuration diagram of a portion of the vertical type process furnace of the substrate-processing apparatus suitably used in the embodiment of the present disclosure, in which a portion of the process furnace is shown in a cross sectional view taken along line A-A in FIG. 1.

As illustrated in FIG. 2, two rod-shaped electrodes 269 and 270 made of a conductive material and having an elongated structure are disposed within the buffer chamber 237 so as to extend along the arrangement direction of the wafers 200 from the lower portion of the reaction tube 203 to the upper portion of the reaction tube 203. The respective rod-shaped electrodes 269 and 270 are installed parallel to the nozzle 249b. Each of the rod-shaped electrodes 269 and 270 is covered with and protected by an electrode protection tube 275 from the lower portion to the upper portion of the rod-shaped electrodes 269 and 270. One of the rod-shaped electrodes 269 and 270 is connected to a high-frequency power source 273 via a matcher 272 and the other is grounded to the earth which is a reference potential. By applying radio-frequency (RF) power from the high-frequency power source 273 to between the rod-shaped electrodes 269 and 270, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be regarded as being included in the plasma source. As will be described later, the plasma source functions as a plasma excitation part (activation mechanism) for plasma-exciting a gas, namely exciting (or activating) a gas in a plasma state.

The electrode protection tubes 275 have a structure that enables the respective rod-shaped electrodes 269 and 270 to be inserted into the buffer chamber 237 in a state in which the rod-shaped electrodes 269 and 270 are isolated from the internal atmosphere of the buffer chamber 237. If a concentration of oxygen (O) within the electrode protection tubes 275 is substantially equal to a concentration of O in the ambient air, the rod-shaped electrodes 269 and 270 respectively inserted into the electrode protection tubes 275 may be oxidized by the heat generated from the heater 207. By filling an inert gas such as an $N_2$ gas or the like into the electrode protection tubes 275, or by purging the interior of the electrode protection tubes 275 with an inert gas such as an $N_2$ gas or the like through the use of an inert gas purge mechanism, it is possible to reduce the concentration of O within the electrode protection tubes 275 and to prevent oxidation of the rod-shaped electrodes 269 and 270.

The exhaust pipe 231 configured to exhaust the internal atmosphere of the process chamber 201 is installed in the reaction tube 203. A vacuum pump 246 as a vacuum exhaust device is coupled to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is a valve configured so that the vacuum exhaust of the interior of the process chamber 201 and the stop of the vacuum exhaust can be performed by opening and closing the APC valve 243 while operating the vacuum pump 246 and so that the internal pressure of the process chamber 201 can be adjusted by adjusting an opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., SUS or the like, and is formed in a disc shape. An O-ring 220, which is a seal member making contact with the lower end portion of the reaction tube 203, is installed on an upper surface of the seal cap 219. A rotation mechanism 267 configured to rotate the boat 217, which will be described later, is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. That is to say, the boat elevator 115 is configured as a transfer device (transfer mechanism) which transfers the boat 217, i.e., the wafers 200, into and out of the process chamber 201.

The boat 217 serving as a substrate support part is configured to support a plurality of, e.g., 25 to 200, wafers 200 in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of, for example, a heat resistant material such as quartz or SiC. Heat insulating plates 218 made of, for example, a heat resistant material such as quartz or SiC are installed in a lower portion of the boat 217 in a horizontal posture and in multiple stages. With this configuration, it is hard for heat generated from the heater 207 to be radiated to the seal cap 219. However, the present embodiment is not limited to this configuration. For example, instead of installing the heat insulating plates 218 in the lower portion of the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L-like shape. The temperature sensor 263 is installed along the inner wall of the reaction tube 203.

Figure 3:
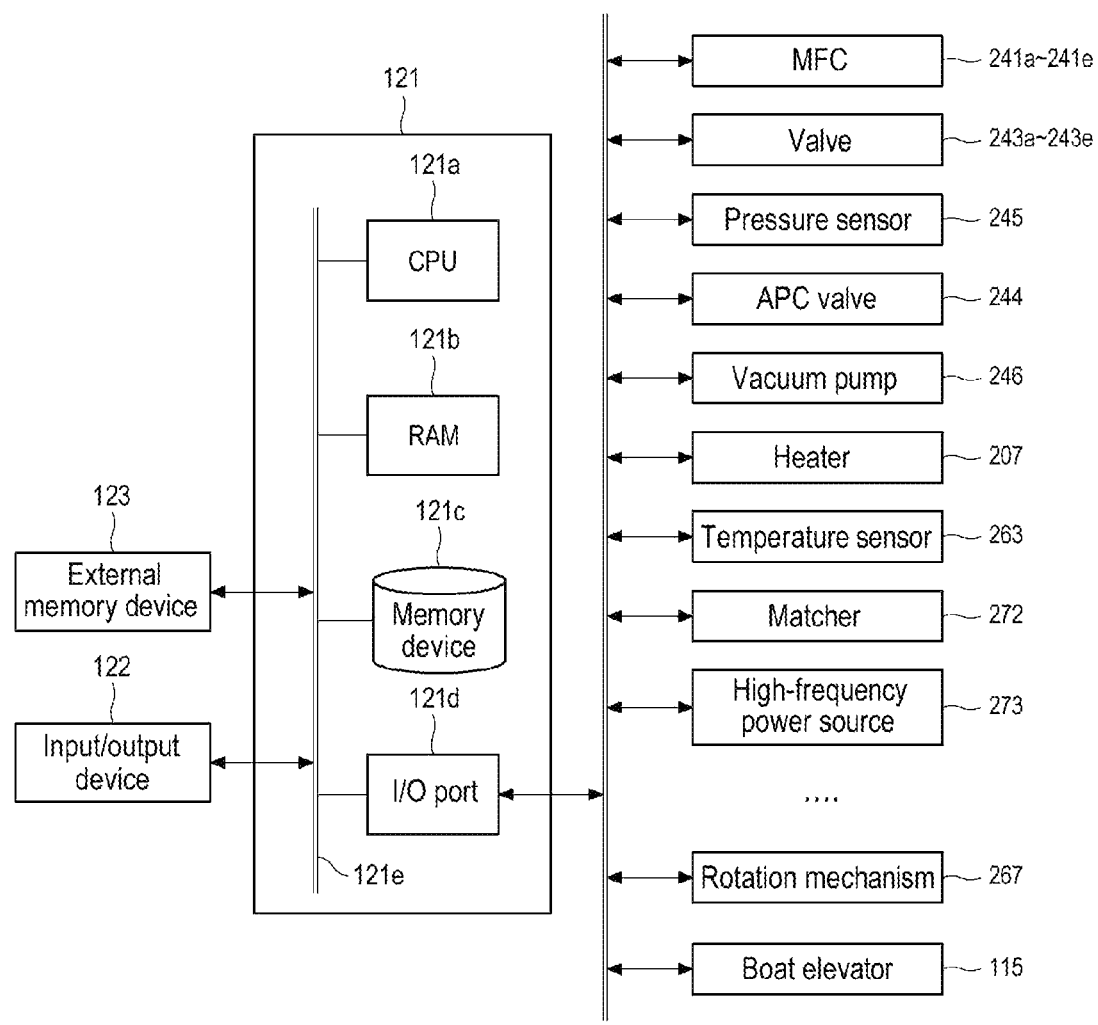
FIG. 3 is a schematic configuration diagram of a controller of the substrate-processing apparatus suitably used in the embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate-processing apparatus, a process recipe in which procedures and conditions of a substrate process as described later or the like is specified, or the like is readably stored in the memory device 121c. The process recipe functions as a program for causing the controller 121 to execute each sequence in the substrate process (to be described later) to obtain a predetermined result. Hereinafter, the process recipe and the control program will be generally and simply referred to as a "program". Furthermore, the process recipe will be simply referred to as a "recipe".

When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, the matcher 272, the high-frequency power source 273, and the like.

The CPU 121a is configured to read the control program from the memory device 121c and execute the same. The CPU 121a is also configured to read the process recipe from the memory device 121c according to an input of an operation command from the input/output device 122. In addition, the CPU 121a is configured to control, according to the contents of the recipe thus read, the flow rate adjusting operation of various kinds of gases performed by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the impedance adjustment operation performed by the matcher 272, the power supply operation performed by the high-frequency power source 273, and the like.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided to the computer using a communication means such as the Internet or a dedicated line, instead of using the external memory device 123.

(2) Film Forming Process

Using the aforementioned substrate-processing apparatus, a sequence example of forming a C-containing nitride film as a protective film on a substrate on which an oxide film is formed, which is one of the processes for manufacturing a semiconductor device, will be described with reference to FIG. 4. In the following descriptions, the operations of the respective parts constituting the substrate-processing apparatus are controlled by the controller 121.

Figure 4:
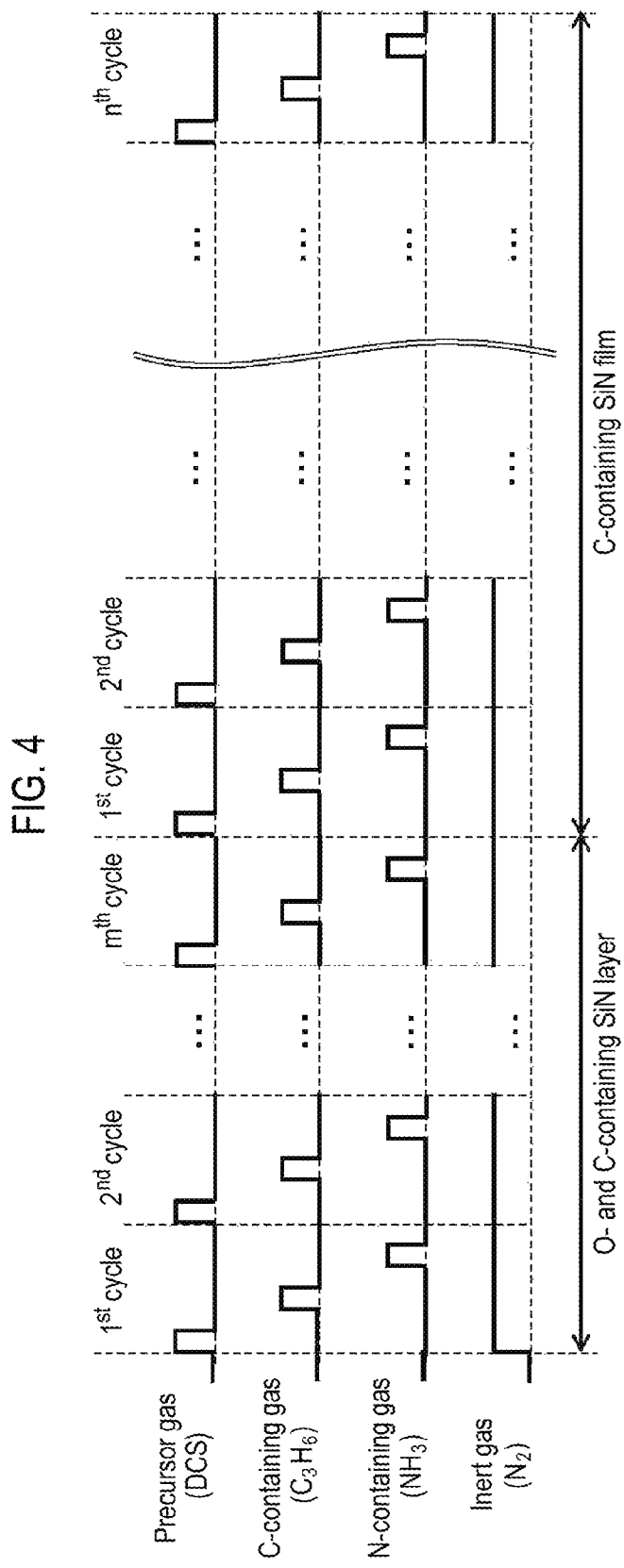
FIG. 4 is a diagram illustrating a gas supply timing in a film forming sequence according to one embodiment of the present disclosure.

In the film forming sequence illustrated in FIG. 4, there are performed: a step of providing a wafer 200 as a substrate on which a silicon oxide film (SiO film) as an oxide film is formed (in a substrate providing step), a step of pre-processing a surface of the SiO film (in a pre-processing step), and a step of forming a silicon nitride film (SiN film) containing C as a protective film on the surface of the SiO film which has been pre-processed, by implementing, a predetermined number of times (n times), a cycle which non-simultaneously (alternately) performs step 1 of supplying a DCS gas as a precursor gas to the wafer 200, step 2 of supplying a $C_3H_6$ gas as a C-containing gas to the wafer 200, and step 3 of supplying an $NH_3$ gas as an N-containing gas to the wafer 200 (in a protective film forming step). The SiN film containing C is referred to as a C-added (doped) SiN film or a C-containing SiN film.

Furthermore, in the pre-processing step illustrated in FIG. 4, there is performed: a cycle which non-simultaneously performs step 1p of supplying a DCS gas to the wafer 200, step 2p of supplying a $C_3H_6$ gas to the wafer 200, and step 3p of supplying an $NH_3$ gas to the wafer 200, a predetermined number of times (m times). At this time, a silicon nitride layer (SiN layer) containing O and C as a seed layer is formed on the surface of the SiO film using the SiO film as an oxygen source (O source). The SiN layer containing O and C is referred to as a C-added silicon oxynitride layer (SiON layer) or a C-containing SiON layer.

In the above, m is an integer of 1 or more. Further, n is an integer greater than m, i.e., an integer of 2 or more. In the present disclosure, for the sake of convenience, the sequence of the film forming process illustrated in FIG. 4 may sometimes be denoted as follows. The same denotation will be used in the modifications and other embodiments, which will be described later.

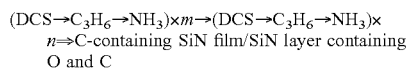

$(DCS \rightarrow C_3H_6 \rightarrow NH_3) \times m \rightarrow (DCS \rightarrow C_3H_6 \rightarrow NH_3) \times n \Rightarrow$ C-containing SiN film/SiN layer containing O and C When the term "wafer" is used herein, it may refer to "a wafer itself" or "a laminated body (aggregate) of a wafer and a predetermined layer or film formed on the surface of the wafer". That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

Substrate Provision Step

When a plurality of wafers 200 are charged in the boat 217 (wafer charging), as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220b.

As described above, the SiO film as an oxide film is formed in advance on at least a portion of the surface of the wafer 200. This film functions as a supply source of O added to a seed layer, i.e., an O source, at a pre-processing step which will be described later. Further, this film becomes at least a portion of a base film when forming a protective film at the pre-processing step to be described later. Also, this film may be a film to be protected by the protective film in an etching process which will be described later. The SiO film may be formed so as to cover the entire surface of the wafer 200 or so as to cover only a portion of the entire surface of the wafer 200. In addition to the SiO film, for example, an Si-containing film such as a silicon oxynitride film (SiON film), a silicon oxycarbide film (SiOC film), or a silicon oxycarbonitride film (SiOCN film), or a metal oxide film, i.e., a high dielectric constant insulating film (high-k film), such as an aluminum oxide film (AlO film), a hafnium oxide film (HfO film), a zirconium oxide film (ZrO film), or a titanium oxide film (TiO film) may be formed as the oxide film. The oxide film (or the oxynitride film, the oxycarbide film, or the oxycarbonitride film) referred to herein includes not only an oxide film intentionally formed by performing a specified process such as, e.g., a CVD process, a plasma CVD process, a thermal oxidation process, or a plasma oxidation process, but also a natural oxide film naturally formed as the surface of the wafer 200 is exposed to the air during the transfer of the wafer 200.

Pressure Regulation and Temperature Adjustment Step

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired film formation temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

Pre-Processing Step

Thereafter, the following three steps, i.e., steps 1p to 3p, are performed.

Step 1p

At this step, a DCS gas is supplied to the wafers 200 in the process chamber 201.

Specifically, the valve 243a is opened to allow the DCS gas to flow through the gas supply pipe 232a. The flow rate of the DCS gas is adjusted by the MFC 241a. The DCS is supplied into the process chamber 201 via the nozzle 249a and is exhausted from the exhaust pipe 231. At this time, the DCS gas is supplied to the wafer 200. Simultaneously, the valve 243d is opened to allow an $N_2$ gas to flow through the gas supply pipe 232d. The flow rate of the $N_2$ gas is adjusted by the MFC 241d. The $N_2$ gas is supplied into the process chamber 201 together with the DCS gas and is exhausted from the exhaust pipe 231.

Furthermore, in order to prevent the DCS gas from entering the nozzle 249b and the buffer chamber 237, the valve 243e is opened to allow the $N_2$ gas to flow through the gas supply pipe 232e. The $N_2$ gas is supplied into the process chamber 201 via the gas supply pipe 232b, the nozzle 249b and the buffer chamber 237 and is exhausted from the exhaust pipe 231.

At this time, by appropriately adjusting the APC valve 244, the internal pressure of the process chamber 201 may be set at a pressure which falls within a range of, for example, 1 to 2,666 Pa, specifically 67 to 1,333 Pa. The supply flow rate of the DCS gas controlled by the MFC 241a may be set at a flow rate which falls within a range of, for example, 10 to 2,000 sccm, specifically 10 to 1,000 sccm. The supply flow rates of the $N_2$ gas controlled by the MFCs 241d and 241e may be respectively set at a flow rate which falls within a range of, for example, 100 to 10,000 sccm. The time period during which the DCS gas is supplied to the wafer 200, namely a gas supply time period (irradiation time period), may be set at a time period which falls within a range of, for example, 1 to 120 seconds, specifically 1 to 60 seconds. The temperature of the heater 207 is set such that the temperature of the wafer 200 becomes a temperature which falls within a range of, for example, 250 to 700 degrees C., specifically 300 to 650 degrees C., more specifically 350 to 600 degrees C.

If the temperature of the wafer 200 is lower than 250 degrees C., a practical deposition rate may not be obtained because the DCS is hardly chemisorbed onto the wafer 200. This may be solved by setting the temperature of the wafer 200 to become 250 degrees C. or more. By setting the temperature of the wafer 200 to become 300 degrees C. or more, further, 350 degrees C. or more, it is possible to further sufficiently adsorb the DCS onto the wafer 200, thus obtaining a further sufficient deposition rate.

If the temperature of the wafer 200 exceeds 700 degrees C., an excessive CVD reaction (excessive vapor phase reaction) occurs to degrade the film thickness uniformity. This makes it difficult to control the film thickness uniformity. By setting the temperature of the wafer to become 700 degrees C. or less, i.e., by causing an appropriate vapor phase reaction to occur, it becomes possible to suppress such degradation of the film thickness uniformity, and to control the film thickness uniformity. In particular, by setting the temperature of the wafer 200 to become 650 degrees C. or less, further, 600 degrees C. or less, the surface reaction becomes dominant relative to the vapor phase reaction. This makes it easy to assure the film thickness uniformity, facilitating the control of the film thickness uniformity.

Accordingly, it is desirable that the temperature of the wafer 200 is set at a temperature which falls within a range of 250 to 700 degrees C., specifically 300 to 650 degrees C., more specifically 350 to 600 degrees C.

By supplying the DCS gas to the wafer 200 under the aforementioned conditions, a first layer, for example, an Si-containing layer containing Cl having a thickness of approximately less than one atomic layer to several atomic layers is formed on the wafer 200 (a base film on which the SiO film is formed). The Si-containing layer containing Cl may include an Si layer containing Cl, an adsorption layer of DCS, or both. Further, O contained in the underlying SiO film may be introduced into the first layer. That is to say, an Si-containing layer containing O and Cl may be formed as the first layer. In the present disclosure, the first layer containing O (the Si-containing layer containing O and Cl) may be simply referred to as an Si-containing layer containing Cl for the sake of convenience.

The Si layer containing Cl is a general name which encompasses not only a continuous layer or discontinuous layer formed of Si and containing Cl but also an Si thin film containing Cl obtained by superposing such layers. The continuous layer formed of Si and containing Cl may be referred to as an Si thin film containing Cl. Si constituting the Si layer containing Cl includes not only Si whose bond to Cl is not completely broken but also Si whose bond to Cl is completely broken.

The adsorption layer of the DCS includes not only a continuous adsorption layer formed of DCS molecules but also a discontinuous adsorption layer formed of DCS molecules. That is to say, the adsorption layer of the DCS includes an adsorption layer having a thickness of one molecular layer formed of DCS molecules or an adsorption layer having a thickness of less than one molecular layer. The DCS molecules constituting the adsorption layer of the DCS include molecules in which a bond of Si and Cl or a bond of Si and H is partially broken. That is to say, the adsorption layer of the DCS may include a physical adsorption layer of the DCS, a chemical adsorption layer of the DCS, or both.

Here, the layer having a thickness of less than one atomic layer refers to an atomic layer formed discontinuously. The layer having a thickness of one atomic layer refers to an atomic layer formed continuously. The layer having a thickness of less than one molecular layer refers to a molecular layer formed discontinuously. The layer having a thickness of one molecular layer refers to a molecular layer formed continuously. The Si-containing layer containing Cl may include both an Si layer containing Cl and an adsorption layer of the DCS. As described above, the expressions such as "one atomic layer", "several atomic layers", and the like will be used for the Si-containing layer containing Cl.

Under a condition in which the DCS gas is autolyzed (or pyrolyzed), namely a condition in which a pyrolysis reaction of the DCS gas occurs, Si is deposited on the wafer 200 to form the Si layer containing Cl. Under a condition in which the DCS gas is not autolyzed (or pyrolyzed), namely a condition in which a pyrolysis reaction of the DCS gas does not occur, the DCS is adsorbed onto the wafer 200 to form the adsorption layer of the DCS. From the viewpoint of increasing a deposition rate, when the Si layer containing Cl is formed on the wafer 200, the deposition rate may be greater than that when the adsorption layer of the DCS gas is formed on the wafer 200.

If the thickness of the first layer formed on the wafer 200 exceeds several atomic layers, a modifying action at step 3p as described later fails to reach the entirety of the first layer. A minimum value of the thickness of the first layer which can be formed on the wafer 200 is less than one atomic layer. Accordingly, it is desirable that the thickness of the first layer falls within a range of approximately less than one atomic layer to several atomic layers. By setting the thickness of the first layer to become equal to one atomic layer or less, namely one atomic layer or less than one atomic layer, it is possible to relatively increase the modifying action at step 3p, which will be described later, and to shorten the time required in modifying the first layer at step 3p. It is also possible to shorten the time required in forming the first layer at step 1p. Eventually, a Process time per one cycle can be reduced and a total Process time can also be reduced. That is to say, the deposition rate can be increased. Further, by setting the thickness of the first layer to become equal to one atomic layer or less, it is possible to enhance the controllability of the film thickness uniformity.

After the first layer is formed, the valve 243a is closed to stop the supply of the DCS gas. At this time, the interior of the process chamber 201 is vacuum-exhausted by the vacuum pump 246 while keeping the APC valve 244 opened. Thus, the unreacted DCS gas or the DCS gas contributed to the formation of the first layer, which remains within the process chamber 201, is removed from the interior of the process chamber 201. At this time, the supply of the $N_2$ gas into the process chamber 201 is maintained while keeping the valves 243d and 243e opened. The $N_2$ gas acts as a purge gas. This makes it possible to enhance the effect of removing the gas, which remains within the process chamber 201, from the interior of the process chamber 201.

At this time, the gas remaining within the process chamber 201 may not be completely removed and the interior of the process chamber 201 may not be completely purged. If the amount of the gas remaining within the process chamber 201 is small, there is no possibility that an adverse effect is generated at step 2p which will be performed later. In this case, the flow rate of the $N_2$ gas supplied into the process chamber 201 does not need a large flow rate. For example, by supplying the $N_2$ gas substantially in the same amount as the volume of the reaction tube 203 (the process chamber 201), it is possible to perform a purge operation such that an adverse effect is not generated at step 2p. By not completely purging the interior of the process chamber 201 in this way, it is possible to shorten the purge time and to improve the throughput. In addition, it is also possible to suppress the consumption of the $N_2$ gas to a necessary minimum level.

As the precursor gas, for example, it may be possible to use, in addition to the DCS gas, an inorganic precursor gas such as a monochlorosilane ($SiH_3Cl$, abbreviation: MCS) gas, a trichlorosilane ($SiHCl_3$, abbreviation: TCS) gas, a tetrachlorosilane gas, i.e., silicon tetrachloride ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, a monosilane ($SiH_4$, abbreviation: MS) gas, a disilane ($Si_2H_6$, abbreviation: DS) gas, a trisilane ($Si_3H_8$, abbreviation: TS) gas or the like. In addition, as the precursor gas, it may be possible to use, for example, an organic precursor gas such as a tetrakis-dimethylaminosilane ($Si[N(CH_3)_2]_4$, abbreviation: 4DMAS) gas, a tris-dimethylaminosilane ($Si[N(CH_3)_2]_3H$, abbreviation: 3DMAS) gas, a bis-diethylaminosilane ($Si[N(C_2H_5)_2]_2H_2$, abbreviation: BDEAS) gas, a bis(tertiarybutylamino)silane ($SiH_2[NH(C_4H_9)]_2$, abbreviation: BTBAS) gas or the like. In the case of using a precursor gas containing Cl, it is desirable to use a precursor having less Cl in number in composition formula (in one molecule). For example, it is desirable to use a DCS gas or an MCS gas.

As the inert gas, for example, it may be possible to use, in addition to the $N_2$ gas, a rare gas such as an Ar gas, a He gas, a Ne gas, a Xe gas or the like.

Step 2p

After step 1p is completed, the $C_3H_6$ gas is supplied to the wafer 200 in the process chamber 201.

At this step, the opening/closing control of the valves 243c, 243d, and 243e is performed in the same procedure as the opening/closing control of the valves 243a, 243d, and 243e performed at step 1p. The $C_3H_6$ gas is supplied from the gas supply pipe 232c into the process chamber 201 through the gas supply pipe 232b, the nozzle 249b, and the buffer chamber 237. The supply flow rate of the $C_3H_6$ gas controlled by the MFC 241c is set at a flow rate which falls within a range of, for example, 100 to 10,000 sccm. The internal pressure of the process chamber 201 is set at a pressure which falls within a range of, for example, 1 to 5,000 Pa, specifically, 1 to 4,000 Pa. A partial pressure of the $C_3H_6$ gas within the process chamber 201 is set at a pressure which falls within a range of, for example, 0.01 to 4,950 Pa. The time period during which the $C_3H_6$ gas is supplied to the wafer 200, namely a gas supply time period (irradiation time period), may be set at a time period which falls within a range of, for example, 1 to 200 seconds, specifically 1 to 120 seconds, more specifically 1 to 60 seconds. Other process conditions may be similar to, for example, the process conditions of step 1p.

By supplying the $C_3H_6$ gas to the wafer 200 under the aforementioned conditions, a C-containing layer having a thickness of less than one atomic layer, namely a discontinuous C-containing layer, is formed on the surface of the first layer (the Si-containing layer containing O and Cl) formed on the wafer 200. The C-containing layer may be a C layer or a chemical adsorption layer of $C_3H_6$, or may include both. Further, in order to reliably perform the reaction between the first layer on which the C-containing layer is formed and the $NH_3$ gas, namely the formation of a silicon nitride layer containing O and C (SiN layer containing O and C), at step 3p which will be described later, it is desirable to stop the supply of the $C_3H_6$ gas before the adsorption reaction of $C_3H_6$ to the surface of the first layer is saturated, namely before the C-containing layer such as the adsorption layer (chemical adsorption layer) of $C_3H_6$ formed on the surface of the first layer or the like becomes a continuous layer (while the C-containing layer is a discontinuous layer).

After the C-containing layer is formed on the surface of the first layer, the valve 243c is closed to stop the supply of the $C_3H_6$ gas. Then, an unreacted $C_3H_6$ gas, the $C_3H_6$ gas contributed to the formation of the C-containing layer, or the reaction byproduct, which remains within the process chamber 201, is removed from the interior of the process chamber 201 by the same process procedures as used at step 1p. At this time, similar to step 1p, the gas or the like remaining within the process chamber 201 may not be completely removed.

As the C-containing gas, it may be possible to use, in addition to the $C_3H_6$ gas, a hydrocarbon-based gas such as, for example, an acetylene ($C_2H_2$) gas, an ethylene ($C_3H_4$) gas or the like. As the inert gas, for example, it may be possible to use, in addition to the $N_2$ gas, a rare gas such as an Ar gas, a He gas, a Ne gas, a Xe gas or the like.

Step 3p

After step 2p is completed, the $NH_3$ gas is supplied to the wafer 200 in the process chamber 201.

At this step, the opening/closing control of the valves 243b, 243d, and 243e is performed in the same procedure as the opening/closing control of the valves 243a, 243d, and 243e performed at step 1p. The $NH_3$ gas is supplied from the gas supply pipe 232b into the process chamber 201 through the nozzle 249b and the buffer chamber 237. The supply flow rate of the $NH_3$ gas controlled by the WC 241b is be set at a flow rate which falls within a range of, for example, 100 to 10,000 sccm. The internal pressure of the process chamber 201 is set at a pressure which falls within a range of, for example, 1 to 4,000 Pa, specifically, 1 to 3,000 Pa. The partial pressure of the $NH_3$ gas within the process chamber 201 is set at a pressure which falls within a range of, for example, 0.01 to 3,960 Pa. By setting the internal pressure of the process chamber 201 at such a relatively high pressure, it becomes possible to thermally activate the $NH_3$ gas under a non-plasma condition. If the $NH_3$ gas is thermally activated and supplied, a relatively more soft reaction can occur, thus relatively softly performing a nitriding process which will be described later. The time period during which the thermally activated $NH_3$ gas is supplied to the wafer 200, namely a gas supply time period (irradiation time period), may be set at a time period which falls within a range of, for example, 1 to 120 seconds, specifically, 1 to 60 seconds. Other process conditions may be similar to, for example, the process conditions applied at step 1p.

By supplying the $NH_3$ gas to the wafer 200 under the aforementioned conditions, at least a portion of the first layer on which the C-containing layer is formed is nitrided (modified). As the first layer on which the C-containing layer is formed is modified, a second layer containing Si, O, C, and N, namely an SiN layer (C-containing SiON layer) containing O and C, is formed. When forming the second layer, an impurity such as Cl or the like contained in the first layer on which the C-containing layer is formed constitutes a gaseous material containing at least Cl during the process of the modification reaction by the $NH_3$ gas and is discharged from the interior of the process chamber 201. That is to say, an impurity such as Cl or the like of the first layer on which the C-containing layer is formed is drawn out or eliminated from the first layer on which the C-containing layer is formed so as to be separated therefrom. Accordingly, the second layer becomes a layer with less impurity such as Cl or the like than that of the first layer on which the C-containing layer is formed.

After the second layer is formed, the valve 243b is closed to stop the supply of the $NH_3$ gas. Then, an unreacted $NH_3$ gas, the $NH_3$ gas contributed to the formation of the second layer, or the reaction byproduct, which remains within the process chamber 201, are excluded from the interior of the process chamber 201 under the same process procedures as those used at step 1p. At this time, similar to step 1p, the gas or the like remaining within the process chamber 201 may not be completely excluded.

As the N-containing gas, for example, it may be possible to use, in addition to the $NH_3$ gas, a hydrogen nitride-based gas such as an $N_2H_2$ gas, an $N_2H_4$ gas, or an $N_3H_8$ gas, a gas containing such compound or the like. As the inert gas, for example, it may be possible to use, in addition to the $N_2$ gas, a rare gas such as an Ar gas, a He gas, a Ne gas, a Xe gas or the like.

Performing a Predetermined Number of Times

A cycle which non-simultaneously, i.e., non-synchronously, performs steps 1p to 3p described above is implemented once or more (m times). Thus, an SiN layer containing O and C having a predetermined composition and a predetermined film thickness can be formed as a seed layer on the wafer 200 (on the SiO film). The seed layer functions as a block layer (diffusion barrier layer) to suppress the spreading of O to the protective film from the underlying SiO film at a protective film forming step which will be described later.

It is desirable that the thickness of the seed layer (the SiN layer containing O and C) is set at a thickness which falls within a range of, for example, 0.05 to 0.3 nm (0.5 to 3 Å), specifically, 0.1 to 0.2 nm (1 to 2 Å).

If the thickness of the seed layer is less than 0.5 Å, the function of the seed layer as the aforementioned block layer may be insufficient to spread the O contained in the underlying SiO film to the protective film. By setting the thickness of the seed layer to become 0.5 Å or more, it becomes possible to sufficiently obtain the function of the seed layer as the block layer and to avoid the spreading (addition) of O to the protective film. By setting the thickness of the seed layer to become 1 Å or more, it becomes possible to enhance the function of the seed layer as the block layer and to reliably avoid the spreading of O to the protective film.

If the thickness of the seed layer exceeds 3 Å, the time period required in forming the seed layer may be lengthened to degrade the productivity of the substrate process. By setting the thickness of the seed layer to become 3 Å or less, it becomes possible to shorten the time period required in forming the seed layer, increasing the productivity of the substrate process. By setting the thickness of the seed layer to become 2 Å or less, it becomes possible to further shorten the time period required in forming the seed layer, further increasing the productivity of the substrate process.

Thus, the thickness of the seed layer may be set at a thickness which falls within a range of, for example, 0.5 to 3 Å, specifically, 1 to 2 Å. By setting the number of performing the cycle at the pre-processing step to fall within a range of, for example, 5 to 30 times, specifically, 10 to 20 times, it is possible to set the thickness of the seed layer to fall within the aforementioned range. Further, it is desirable that the thickness of the seed layer is set to fall within the aforementioned range and to become thinner than that of the C-containing SiN film formed at the protective film forming step. For example, if the thickness of the C-containing SiN film is set at a thickness of 3 Å, it is desirable that the thickness of the seed layer is set to fall within a range of approximately 0.5 to 1 Å.

Protective Film Forming Step

After the formation of the seed layer is completed, steps 1 to 3 are performed as described above. The process procedures and process conditions of steps 1 to 3 may be similar to, for example, those of steps 1p to 3p. At the protective film forming step, spreading of O from the SiO film is suppressed by the seed layer mentioned above. Thus, by performing steps 1 to 3, an SiN layer not containing O and containing C (C-containing SiN layer not containing O) is formed on the seed layer.

Figure 9:
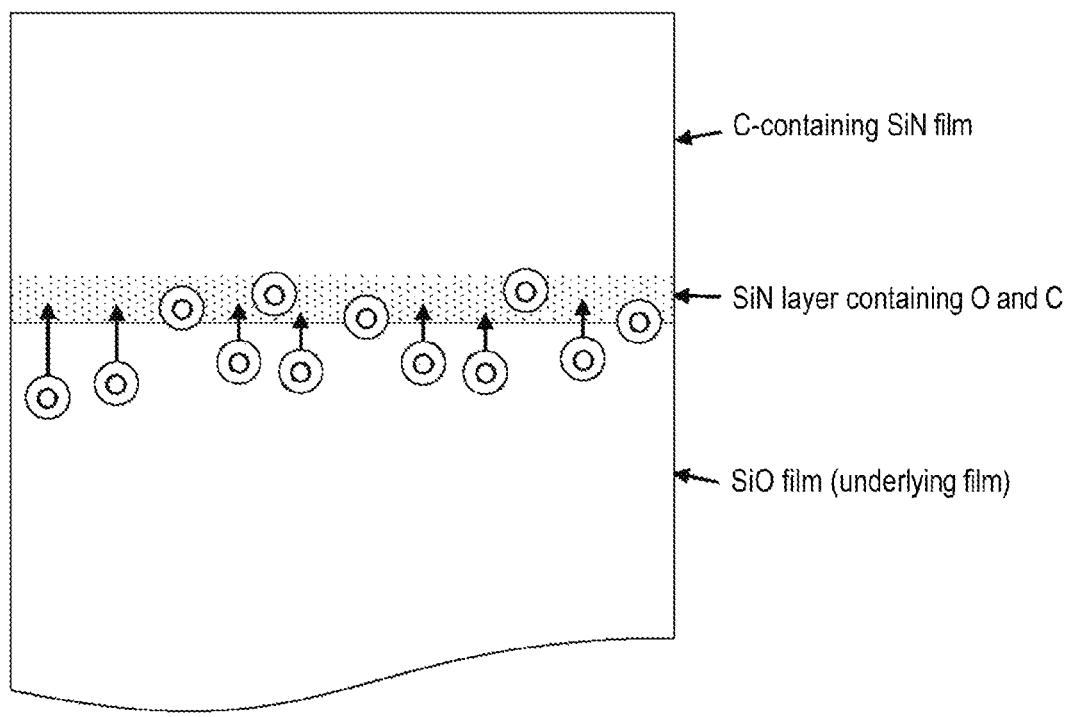
FIG. 9 is a view illustrating a cross sectional structure of a film formed on a substrate.

Further, a cycle which non-simultaneously, i.e., non-synchronously, performs steps 1 to 3 described above is implemented two or more times (n times). Thus, an SiN film not containing O and containing C (the C-containing SiN film) having a predetermined composition and a predetermined film thickness can be formed on the wafer 200 (on the SiN layer containing O and C). The number of times (n times) of implementing the cycle at this step may be set greater than the number of times (m times) of implementing the cycle at the pre-processing step mentioned above (n>m). The C-containing SiN film functions as a protective film to protect an underlying SiO film at an etching process which will be described later. FIG. 9 illustrates a cross sectional structure of a film formed on the wafer 200 according to the film forming sequence illustrated in FIG. 4.

It is desirable that the thickness of the protective film (the C-containing SiN film) is set at a thickness which falls within a range of 0.2 to 10 nm (2 to 100 Å), specifically 0.5 to 10 nm (5 to 100 Å), more specifically 1 to 10 nm (10 to 100 Å).

If the film thickness of the C-containing SiN film is less than 2 Å, this film may not function as the protective film. By setting the film thickness of the C-containing SiN film to become 2 Å or more, this film can function as the protective film. By setting the film thickness of the C-containing SiN film to become 5 Å or more, this film can sufficiently function as the protective film. Further, by setting the film thickness of the C-containing SiN film to become 10 Å or more, it becomes possible to further enhance the function of the C-containing SiN film as the protective film, and it becomes possible to allow this film to reliably function as the protective film.

Furthermore, if the film thickness of the C-containing SiN film exceeds 100 Å, the technical meaning of adding C to the SiN film may be reduced. That is to say, if the film thickness exceeds 100 Å, even when C is not added to the SiN film, namely even when the protective film is formed of an SiN film not containing C, this film can sufficiently function as the protective film. This is because, if the film thickness of the SiN film exceeds 100 Å, the influence of a pin hole of the film becomes sufficiently small.

Here, the term "pin hole" refers to a path along which an etchant such as an etching gas or an etching solution enters toward a base side of the film, namely the SiO film side in the present embodiment, when the etchant is supplied to the film. The pin hole is not limited to a case of being formed as a physical hole. For example, the pin hole may be formed due to various factors such as a local crack, a degradation of a local film density, an increase in a local defect density, or a change in a local composition or a crystal structure, which may occur in a film. With the pin hole present in the protective film, when an etchant is supplied to the protective film, the etchant may reach the base side through the pin hole so that the base side may be etch-damaged. Further, the etchant may enter into the pin hole to cause the protective film itself to be etched, resulting in a degradation of the function as the protective film.

According to extensive research of the present inventors, it was confirmed that, if the film thickness of the SiN film not containing C is small, a pin hole is easy to generate. The present inventors confirmed that, when the protective film is formed of the SiN film not containing C, if the film thickness thereof is 100 Å or less, influence of the pin hole may occur, and if the film thickness is 30 Å or less, the influence of the pin hole is increased to make the function of the SiN film as the protective film insufficient. In contrast, by adding C to the SiN film, namely by forming the protective film of the C-containing SiN film, even when the film thickness is 100 Å or less, it becomes possible to suppress the generation of the pin hole and to enhance the function as the protective film. It is considered that this is because an Si—C bond has a stronger bonding force than an Si—N bond and it is possible to reduce a defect in a film by including an Si—C bond by adding C to the film. The present inventors confirmed that, if the protective film is formed of the C-containing SiN film, even when the film thickness of the SiN film is 100 Å or less, ultimately 30 Å or less, the SiN film can sufficiently function as the protective film. In this regard, it may be considered that forming the protective film of the C-containing SiN film is meaningful particularly if the protective film is required to have a thin film having a film thickness of 100 Å or less.

From the above, it is desirable that the film thickness of the C-containing SiN film is set at a thickness which falls within a range of 2 to 100 Å, specifically 5 to 100 Å, more specifically 10 to 100 Å. As described above, it is desirable that the film thickness of the C-containing SiN film is set larger than the thickness of the seed layer. Further, it was confirmed that, even when the film thickness of the C-containing SiN film is set at a thickness which falls within a range of 2 to 30 Å, specifically 5 to 30 Å, more specifically 10 to 30 Å, it is possible to suppress the generation of the pin hole and to allow the SiN film to sufficiently function as the protective film.

Furthermore, it is desirable that a concentration of C in the protective film (the C-containing SiN film) is set at a concentration which falls within a range of, for example, 3 to 10 atomic %, specifically 5 to 9 atomic %, more specifically 7 to 8 atomic %.

If the concentration of C in the C-containing SiN film is less than 3 atomic %, etching tolerance of the film may be insufficient and a pin hole may be easily generated. Thus, the C-containing SiN film may not function as the protective film. By setting the concentration of C in the C-containing SiN film to become 3 atomic % or more, it is possible to increase the etching tolerance of the film, to suppress the generation of the pin hole, and to allow the film to function as the protective film. By setting the concentration of C in the C-containing SiN film to become 5 atomic % or more, it is possible to increase Si—C bonds included in the film and allow the film to sufficiently function as the protective film. By setting the concentration of C in the C-containing SiN film to become 7 atomic % or more, it is possible to further increase Si—C bonds included in the film and allow the film to reliably function as the protective film.

If the concentration of C in the C-containing SiN film exceeds 10 atomic %, C included in the film may spread to other films, for example, degrading a function of the semiconductor device or causing a defective process of the film. By setting the concentration of C in the C-containing SiN film to become 10 atomic % or less, it is possible to suppress the spreading of C contained in the film. By setting the concentration of C in the C-containing SiN film to become 9 atomic % or less, it is possible to sufficiently suppress the spreading of C contained in the film. By setting the concentration of C in the C-containing SiN film to become 8 atomic % or less, it is possible to reliably suppress the spreading of C contained in the film.

As described above, it is desirable that the concentration of C in the C-containing SiN film is set at a concentration which falls within a range of 3 to 10 atomic %, specifically, 5 to 9 atomic %, more specifically, 7 to 8 atomic %. It was confirmed that, by setting the process conditions of the protective film forming step to fall within the aforementioned process condition range, it is possible to set the concentration of C in the C-containing SiN film at a concentration within the aforementioned range.

Moreover, it is desirable that the aforementioned cycle is repeated a plural number of times. That is to say, it is desirable that the thickness of the C-containing SiN layer formed per cycle is set smaller than a desired film thickness and the aforementioned cycle is repeated a plural number of times until the thickness of the C-containing SiN layer becomes equal to the desired film thickness.

Purge Step and Atmospheric Pressure Return Step

After the formation of the protective film is completed, the $N_2$ gas is supplied from the respective gas supply pipes 232d and 232e into the process chamber 201 and is exhausted from the exhaust pipe 231. The $N_2$ gas acts as a purge gas. Thus, the interior of the process chamber 201 is purged and the gas or the reaction byproduct, which remains within the process chamber 201, is removed from the interior of the process chamber 201 (in a purging operation). Thereafter, the internal atmosphere of the process chamber 201 is substituted with an inert gas (in an inert gas substitution process). The internal pressure of the process chamber 201 is returned to an atmospheric pressure (in an atmospheric pressure return operation).

Unloading Step

Thereafter, the seal cap 219 is moved down by the boat elevator 115 to open the lower end of the manifold 209. Then, the processed wafers 200 supported on the boat 217 are unloaded from the lower end of the reaction tube 203 outside the reaction tube 203 (in a boat unloading operation). The processed wafers 200 are discharged from the boat 217 (in a wafer discharging operation).

(3) Etching Process

After the wafers 200 are unloaded from the interior of the process chamber 201, additional film forming processes, a resist pattern forming process and the like are further performed on the wafers 200 which have been subjected to the film forming process. Then, the wafers 200 which were subjected to such processes are performed, and are carried into a reaction chamber (second process chamber) included in an etching device serving as a second substrate processing part. Then, in a state where the interior of the reaction chamber is controlled to have a predetermined process pressure and a process temperature, an etching gas is supplied as an etchant to the wafers 200 in the reaction chamber to perform an etching process to the film or the like formed on the surfaces of the wafers 200. At this time, the C-containing SiN film formed on the wafers 200 functions as the protective film to protect the underlying SiO film.

As the etching gas, it may be possible to use, for example, a hydrogen fluoride (HF) gas diluted with the $N_2$ gas, or the like. An example of process conditions of the etching process is as follows:

Flow rate of the HF gas: 100 to 2,000 sccm, specifically 1,000 to 2,000 sccm

Flow rate of the $N_2$ gas: 1,000 to 8,000 sccm, specifically 7,000 to 8,000 sccm Internal pressure of the reaction chamber: 133 to 26,600 Pa, specifically 13,300 to 26,600 Pa Internal temperature of the reaction chamber: 50 to 100 degrees C., specifically 50 to 75 degrees C.

Process time: 0.5 to 10 min., specifically 0.5 to 1 min.

After a predetermined period of time since the HF gas started to be supplied, when the etching process on the wafers 200 is completed, the supply of the HF gas into the reaction chamber is stopped and the interior of the reaction chamber is exhausted. Thereafter, after the internal atmosphere of the reaction chamber is substituted with an inert gas and the internal pressure of the reaction chamber is returned to atmospheric pressure, the wafers 200 which have been subjected to the etching process are unloaded from the interior of the reaction chamber.

As the etchant, for example, it may be possible to use, in addition to the HF gas, a fluoride-based gas such as a fluoride ($F_2$) gas or the like, or a chloride-based gas such as a hydrogen chloride (HCl) gas or the like. Process conditions of these cases may be similar to the process conditions described above. However, it is desirable that the internal temperature of the reaction chamber is set at a temperature which falls within a range of about 100 to 500 degrees C. Further, these gases may be mixed to be used, an H-containing gas (reducing gas) such as an $H_2$ gas or the like may be added to these gases so as to be used, or these gases may be activated by plasma so as to be used. As the etchant, it may also be possible to use an etching solution such as, for example, an HF aqueous solution, an HCl aqueous solution or the like, rather than a gas.

(4) Effects According to the Present Embodiment

According to the present embodiment, one or more effects set forth below may be achieved.

(a) By forming the seed layer as a base film of the protective film in advance, and allowing the seed layer to act as a block layer to suppress the spreading of O from the SiO film, it becomes possible to suppress the addition of O to the C-containing SiN film formed on the seed layer. This makes it possible to enhance film characteristics of the C-containing SiN film formed on the seed layer.

(b) By forming the seed layer on the wafer 200 in advance, it becomes possible to shorten the incubation time of the C-containing SiN film formed on the seed layer. Further, by forming the seed layer as a continuous layer, it becomes possible to allow the growth starting timings of the C-containing SiN film to be uniform over the entire in-plane region of the wafers 200. This makes it possible to improve the step coatability or film thickness uniformity of the C-containing SiN film, and to enhance the function thereof as the protective film.

(c) By forming the protective film of the C-containing SiN film, even when the protective film is thinned, it becomes possible to form the protective film as a film without a pin hole, i.e., a pin hole-free film. Accordingly, even when the protective film is thinned, it becomes possible to avoid an etching damage to the base film entailed by the etching process. In addition, by forming the protective film of the pin hole-free film, it becomes possible to suppress the etching of the protective film itself entailed by the etching process and to avoid a degradation of the function of the C-containing SiN film as the protective film.

(d) By forming the protective film of the C-containing SiN film, namely by including an Si—C bond having a stronger bonding force than that of an Si—N bond in a film, it is possible to form this film as a film having higher tolerance (etching tolerance) to an etchant such as HF or the like. This makes it possible to enhance the function of the C-containing SiN film as the protective film. Further, it becomes possible to suppress the etching of the protective film itself entailed by the etching process and to maintain the function of the C-containing SiN film as the protective film.

(e) In the film forming process, by non-simultaneously performing the supply of the DCS gas to the wafer 200, the supply of the $C_3H_6$ gas to the wafer 200, and the supply of the $NH_3$ gas to the wafer 200, it becomes possible to enhance the step coatability or film thickness controllability of the C-containing SiN film, compared with the case where the supplies of these gases are simultaneously performed. As a result, it becomes possible to enhance the function of the C-containing SiN film as the protective film.

(f) The effects mentioned above can be similarly achieved in the case where an Si source other than the DCS gas is used as the precursor gas, or in the case where a C source other than the $C_3H_6$ gas is used as the C-containing gas, or in the case where an N source other than the $NH_3$ gas is used as the N-containing gas. Further, the effects mentioned above can be similarly achieved in the case where an etchant other than the HF gas is used as the etching gas.

(5) Exemplary Modifications

The sequence of the film forming process of the present embodiment is not limited to the one illustrated in FIG. 4 but may be modified as in modifications described below.

Modification 1

At the pre-processing step, an SiN layer not containing O and C (hereinafter, referred to as an "SiN layer not containing O" or simply an "SiN layer") may be formed as a seed layer.

Figure 5:
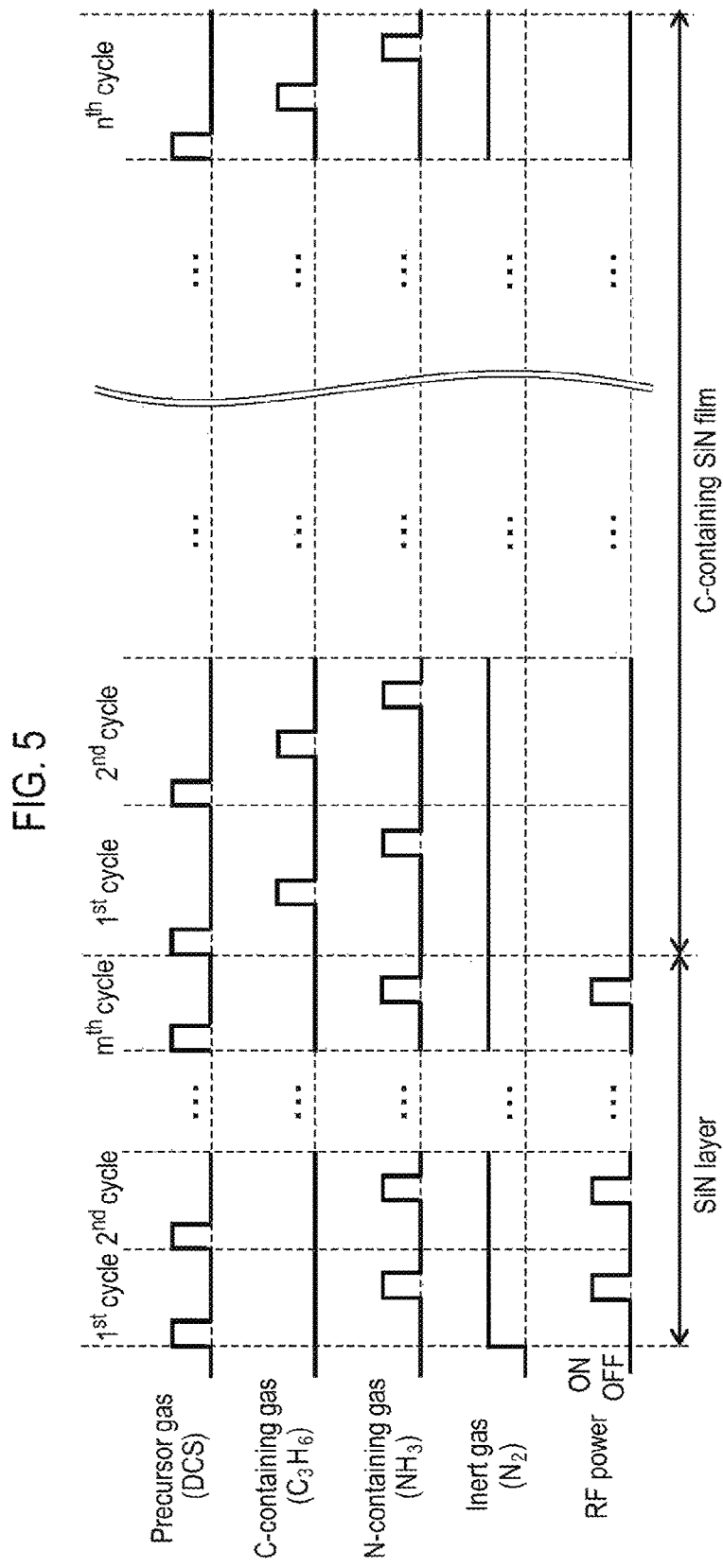
FIG. 5 is a diagram illustrating a modification of the gas supply timing in the film forming sequence of one embodiment of the present disclosure.

For example, as illustrated in FIG. 5, it is possible to form the SiN layer not containing O as a seed layer by implementing, a predetermined number of times (m times), a cycle which non-simultaneously (alternately) performs a step of supplying a DCS gas to the wafer 200 and a step of supplying a plasma-excited $NH_3$ gas ($NH_3$*gas) to the wafer 200. As mentioned above, during the step of supplying the DCS gas, O contained in the SiO film may be spread to the layer formed on the SiO film. By supplying the plasma-excited $NH_3$ gas to the layer containing O, O can be desorbed from the layer. As a result, it is possible to form the SiN layer not containing O on the SiO film. The film forming sequence of this modification may be denoted as follows.

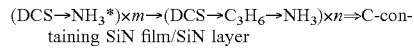

Figure 6:
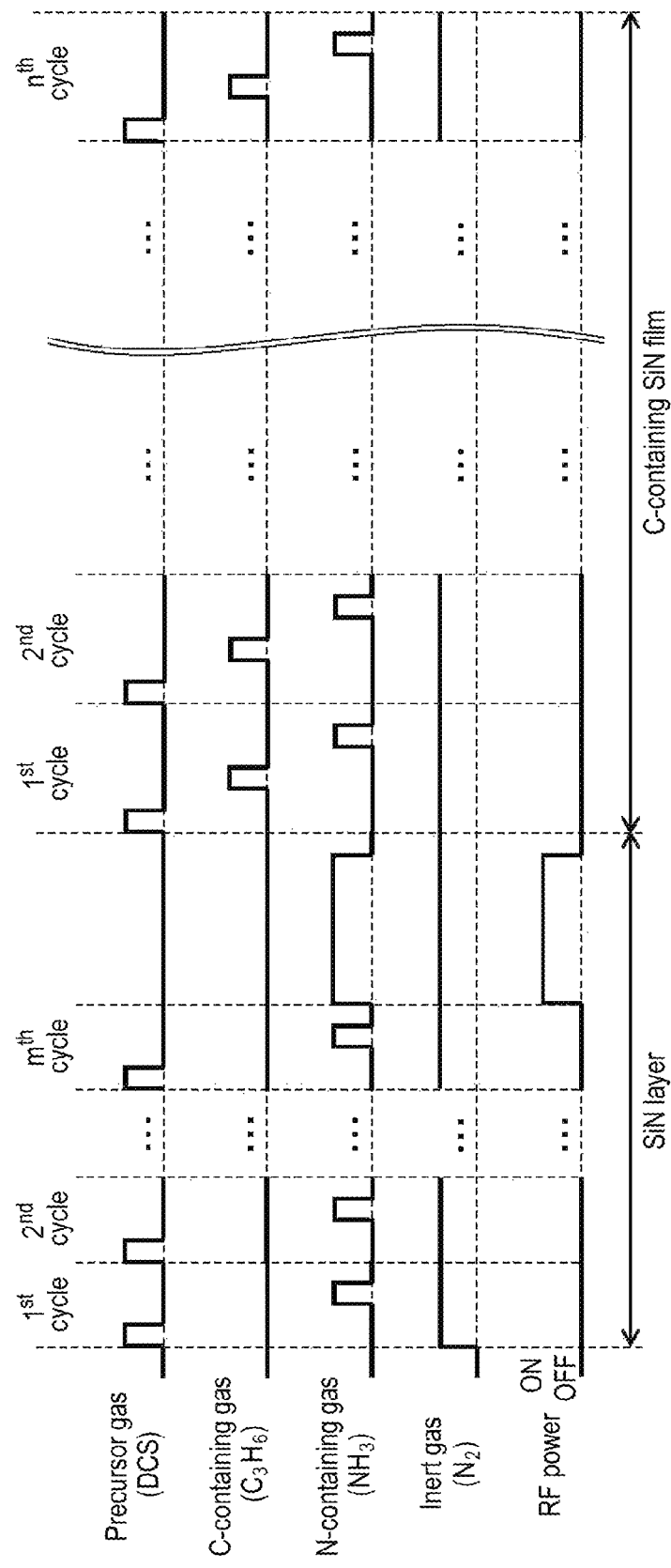
FIG. 6 is a diagram illustrating a modification of the gas supply timing in the film forming sequence of one embodiment of the present disclosure.

Furthermore, for example, as illustrated in FIG. 6, it is possible to form an SiN layer not containing O as a seed layer by implementing, a predetermined number of times (m times), a cycle which non-simultaneously (alternately) performs a step of supplying a DCS gas to the wafer 200 and a step of supplying an $NH_3$ gas to the wafer 200, and subsequently performing a step of supplying a plasma-excited $NH_3$ gas to the wafer 200. The film forming sequence of this modification may be denoted as follows.

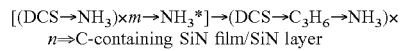

In addition, for example, it is possible to form an SiN layer not containing O as a seed layer by implementing, a predetermined number of times ($m_2$ times), a cycle which non-simultaneously (alternately) performs a step of performing, a predetermined number of times ($m_1$ times), a set which non-simultaneously (alternately) performs a substep of supplying a DCS gas to the wafer 200 and a substep of supplying an $NH_3$ gas to the wafer 200, and a step of supplying a plasma-excited $NH_3$ gas to the wafer 200. The film forming sequence of this modification may be illustrated as follows.

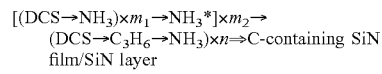

In the case where the plasma-excited $NH_3$ gas is supplied to the wafer 200, the supply flow rate of the $NH_3$ gas controlled by the MFC 241b is set at a flow rate which falls within a range of, for example, 100 to 10,000 sccm. The high-frequency power applied between the rod-shaped electrodes 269 and 270 is set at electric power which falls within a range of, for example, 50 to 1,000 W. The internal pressure of the process chamber 201 is set at a pressure which falls within a range of, for example, 1 to 100 Pa. The time period during which active species obtained by plasma-exciting the $NH_3$ gas are supplied to the wafer 200, namely the gas supply time period (irradiation time period), is set at a time period which falls within a range of, for example, 1 to 120 seconds, specifically 1 to 60 seconds.

Figure 10:
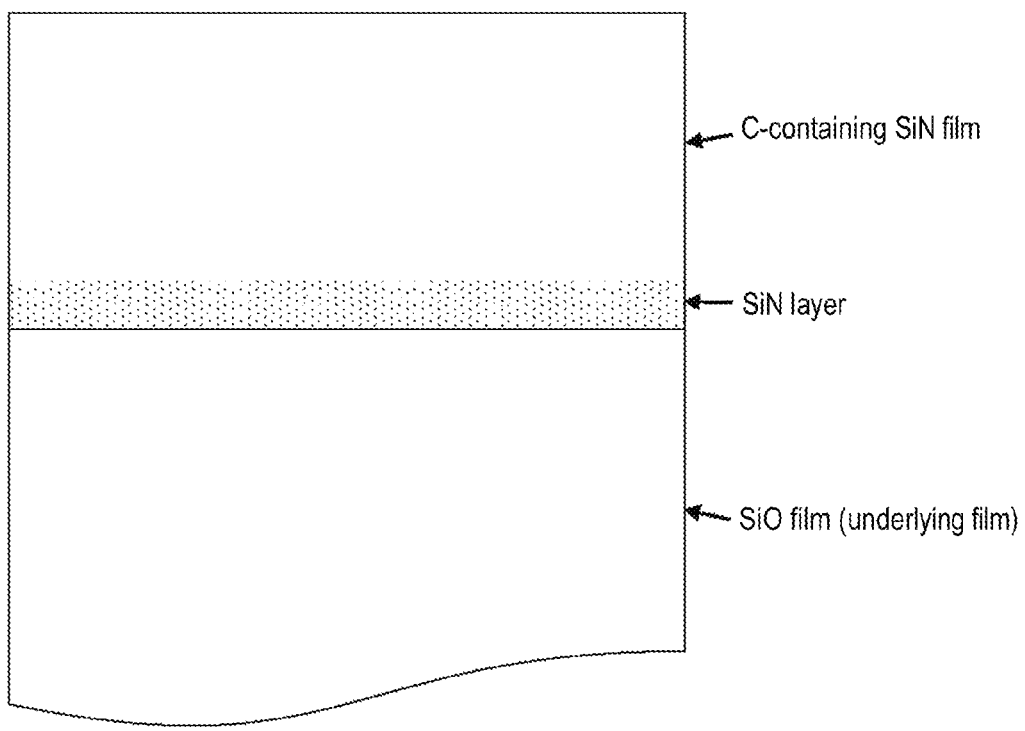
FIG. 10 is a view illustrating a cross sectional structure of a film formed on a substrate.

FIG. 10 illustrates a cross sectional structure of a film formed on the wafer 200 according to the film forming sequence of this modification. Even in this modification, the same effects as those of the film forming sequence illustrated in FIG. 4 may be achieved. That is to say, by allowing the SiN layer (the seed layer) not containing O formed at the pre-processing step to function as a block layer to suppress the spreading of O from the SiO film, it is possible to suppress the addition of O to the C-containing SiN film. This makes it possible to enhance film characteristics of the C-containing SiN film. In addition, since the seed layer is a layer not containing O, O may not be spread to the C-containing SiN film from the seed layer. This makes it possible to more reliably suppress the addition of O to the C-containing SiN film.

Modification 2

At the pre-processing step, the surface of the SiO film may be modified by supplying a modification gas to the wafer 200.

Figure 7:
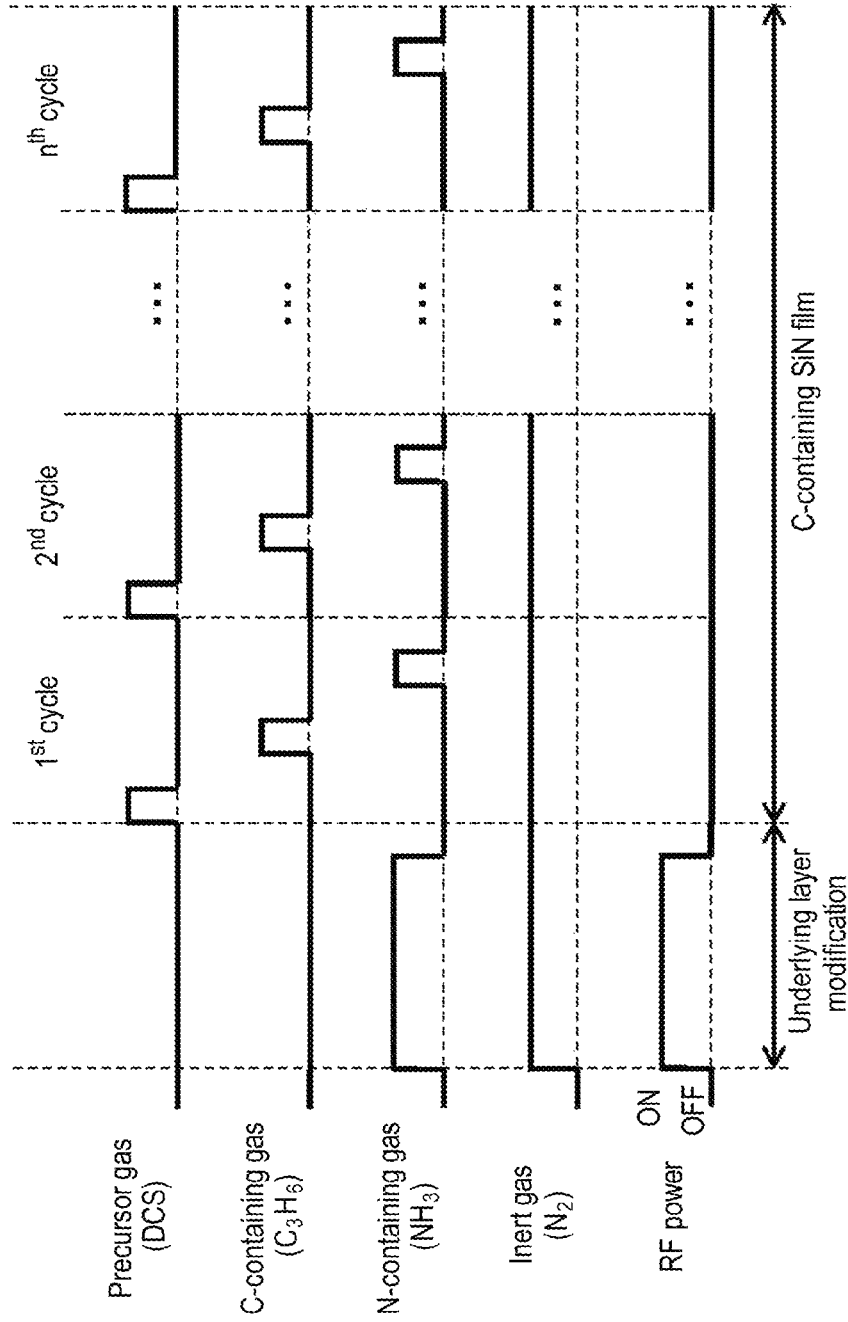
FIG. 7 is a diagram illustrating a modification of the gas supply timing in the film forming sequence of one embodiment of the present disclosure.

For example, as illustrated in FIG. 7, by supplying a plasma-excited N-containing gas as the modification gas to the wafer 200, it is possible to appropriately modify the surface of the SiO film and to form a surface-modified layer on the surface of the SiO film. As the N-containing gas, it may be possible to use at least one selected from a group consisting of an $NH_3$ gas and an $N_2H_4$ gas.

Furthermore, for example, by supplying a plasma-excited inert gas as the modification gas to the wafer 200, it is possible to appropriately modify the surface of the SiO film and to form a surface-modified layer on the surface of the SiO film. As the inert gas, it may be possible to use, in addition to the $N_2$ gas, at least one selected from a group consisting of an Ar gas, a He gas, a Ne gas, and a Xe gas.

Moreover, for example, by supplying a plasma-excited H-containing gas as the modification gas to the wafer 200, it is possible to appropriately modify the surface of the SiO film and to form a surface-modified layer on the surface of the SiO film. As the H-containing gas, it may be possible to use at least one selected from a group consisting of an $H_2$ gas and a $D_2$ gas.

Further, for example, by supplying a plasma-excited O-containing gas as the modification gas to the wafer 200, it is possible to appropriately modify the surface of the SiO film and to form a surface-modified layer on the surface of the SiO film. As the O-containing gas, it may be possible to use, for example, an $O_2$ gas. In addition, for example, by supplying an $O_3$ gas or an $O_2+H_2$ gas as the modification gas to the wafer 200, it is also possible to appropriately modify the surface of the SiO film and to form a surface-modified layer on the surface of the SiO film.

By modifying the surface of the SiO film, it becomes possible to remove an impurity from the surface of the SiO film and to increase purity of the surface of the SiO film. It also becomes possible to remove a defect from the surface of the SiO film. It also becomes possible to firmly bond elements constituting the SiO film on the surface of the SiO film and to increase film density. This makes it possible to suppress the addition of O to the C-containing SiN film by allowing the surface-modified layer formed at the pre-processing step to act as a block layer to suppress the spreading of O from the SiO film. As a result, when the C-containing SiN film is formed on the SiO film, it becomes possible to avoid generation of a pin hole in the C-containing SiN film. Furthermore, at the pre-processing step, by supplying the plasma-excited N-containing gas to the wafer 200, it become possible to plasma-nitride the surface of the SiO film and to form an SiN layer not containing O on the surface of the SiO film, thus further increasing the block effects mentioned above. Moreover, at the pre-processing step, by supplying the plasma-excited O-containing gas to the wafer 200, it becomes possible to oxidize the surface of the SiO film and to further increase the modification effects mentioned above.

Figure 11:
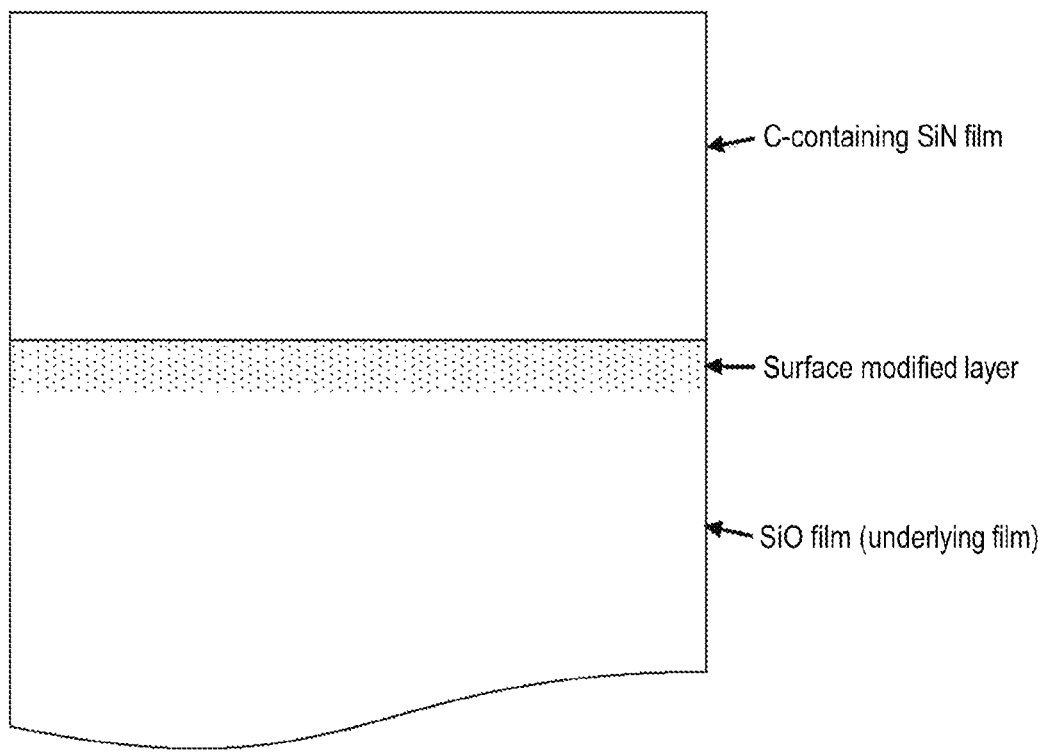
FIG. 11 is a view illustrating a cross sectional structure of a film formed on a substrate.

FIG. 11 illustrates a cross sectional structure of a film formed on the wafer 200 according to the film forming sequence of this modification. Even in this modification, the same effects as those of the film forming sequence illustrated in FIG. 4 may be achieved.

In the case where the plasma-excited modification gas is supplied to the wafer 200, the supply flow rate of the modification gas controlled by the MFC 241b is set at a flow rate which falls within a range of, for example, 100 to 10,000 sccm. The high-frequency power applied between the rod-shaped electrodes 269 and 270 is set at electric power which falls within a range of, for example, 50 to 1,000 W. The internal pressure of the process chamber 201 is set at a pressure which falls within a range of, for example, 1 to 100 Pa. The time duration during which active species obtained by plasma-exciting the modification gas is supplied to the wafer 200, namely the gas supply time (irradiation time), is set at a time period which falls within a range of, for example, 10 to 600 seconds, specifically 30 to 300 seconds.

Modification 3

At the pre-processing step or the protective film forming step, a cycle which non-simultaneously performs a step of supplying a precursor gas to the wafer 200 and a step of supplying a gas containing C and N to the wafer 200 may be implemented a predetermined number of times (n times). As the precursor gas, it may be possible to use, for example, a chlorosilane precursor gas such as an HCDS gas. As the gas containing C and N, it may be possible to use, for example, an amine-based gas such as a triethylamine $((C_2H_5)_3N$: abbreviation: TEA) gas. In this case, the SiN layer containing O and C is formed as a seed layer. The supply conditions of the gas containing C and N may be similar to, for example, those of the N-containing gas at step 3p of the film forming sequence illustrated in FIG. 4. The film forming sequence of this modification may be illustrated as follows.

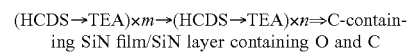

Furthermore, at the pre-processing step or the protective film forming step, a cycle which non-simultaneously performs a step of supplying a precursor gas containing C to the wafer 200 and a step of supplying an N-containing gas to the wafer 200 may be implemented a predetermined number of times (n times). As the precursor gas containing C, it may be possible to use, for example, an alkylhalosilane precursor gas such as a 1,1,2,2-tetrachloro-1,2-dimethylsilane $((CH_3)_2Si_2Cl_4$, abbreviation: TCDMDS) gas or an alkylenehalosilane precursor gas such as a bis(trichlorosilyl) methane $((SiCl_3)_2CH_2$, abbreviation: BTCSM) gas. Any precursor is a precursor including Si—C bonds and acts as an Si source and a C source. In this case, the SiN layer containing O and C is formed as a seed layer. The supply conditions of the precursor gas containing C may be similar to, for example, those of the precursor gas at step 1p of the film forming sequence illustrated in FIG. 4. The film forming sequence of this modification may be illustrated as follows.

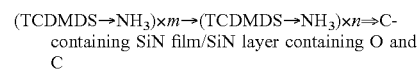

Even in this modification, the same effects as those of the film forming sequence illustrated in FIG. 4 may be achieved.

Modification 4

The C-containing SiN film as a protective film may be directly formed on the surface of the SiO film, without performing the pre-processing step. Even in this modification, the same effects as those of the film forming sequence illustrated in FIG. 4 may be achieved. That is to say, by adding C to the SiN film, it becomes possible to form the SiN film as a pin hole-free film even when the protective film is thinned.

Modification 5

After the C-containing SiN film is formed, a cap layer may be formed on the surface of the C-containing SiN film within the same process chamber 201, namely, in-situ.

Figure 8:
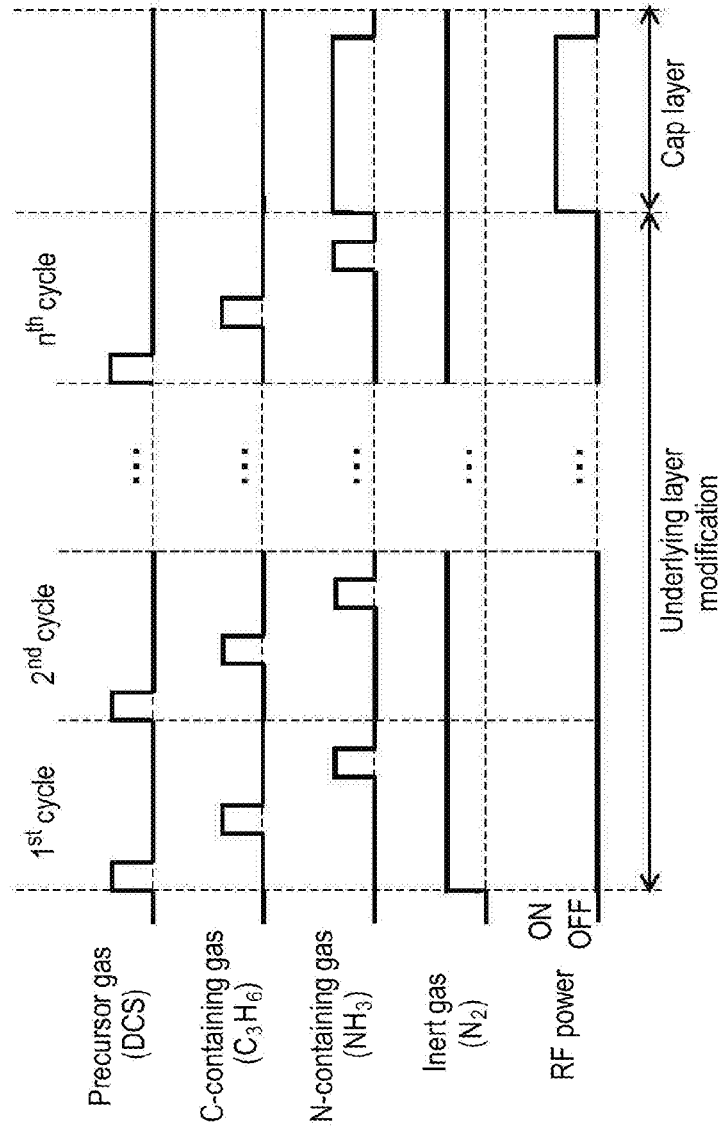
FIG. 8 is a diagram illustrating a modification of the gas supply timing in the film forming sequence of one embodiment of the present disclosure.

For example, as illustrated in FIG. 8, by modifying the surface of the C-containing SiN film by supplying a plasma-excited N-containing gas as a modification gas to the wafer 200 on which the C-containing SiN film is formed, it is possible to form an SiN layer as the cap layer on the surface of the C-containing SiN film. The process procedures and process conditions at this time may be similar to those illustrated in modification 2. Furthermore, in FIG. 8, for the sake of convenience, the pre-processing step is not illustrated. The film forming sequence of this modification may be illustrated as follows. As the N-containing gas, it may be possible to use, in addition to the $NH_3$ gas, an $N_2H_4$ gas, an $N_2H_4$ gas, and an $N_3H_8$ gas.

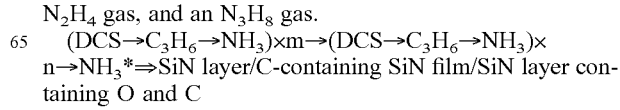

Figure 12:
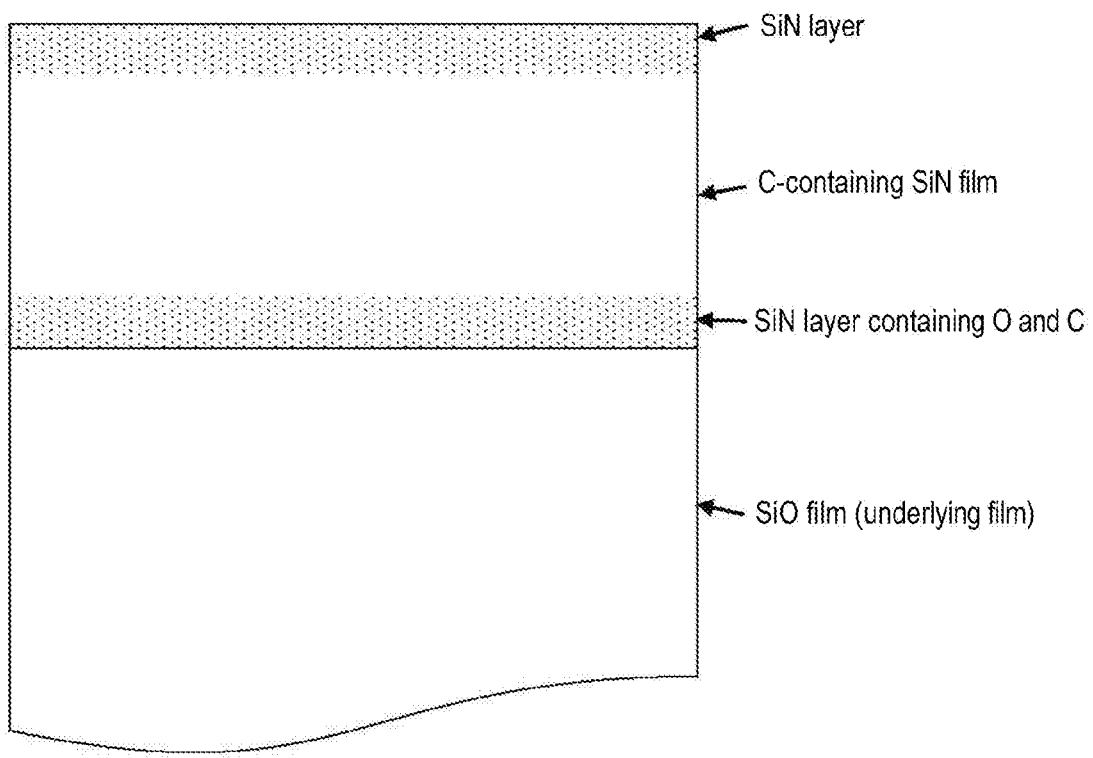
FIG. 12 is a view illustrating a cross sectional structure of a film formed on a substrate.

FIG. 12 illustrates a cross sectional structure of a film formed on the wafer 200 according to the film forming sequence of this modification. Even in this modification, the same effects as those of the film forming sequence illustrated in FIG. 4 may be achieved. Furthermore, by forming the cap layer (SiN layer) on the surface of the C-containing SiN film, when the wafer 200 on which the C-containing SiN film is formed is transferred in the air, it is possible to suppress the oxidation of the C-containing SiN film due to water vapor (H₂O) in the air. In addition, after the C-containing SiN film is formed, by forming a cap layer in a state where the wafer 200 which has been subjected to the film forming process is accommodated in the process chamber 201, without unloading from the interior of the process chamber 201, it becomes possible to more reliably suppress the oxidation of the C-containing SiN film.

It is also possible to form the cap layer under the same process procedures as those of the pre-processing step illustrated in modification 1, in addition to the aforementioned process procedures. The film forming sequence of this modification may be illustrated as follows.

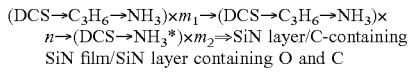
(DCS→C₃H₆→NH₃)×m₁→(DCS→C₃H₆→NH₃)×
n→(DCS→NH₃*)×m₂⇒SiN layer/C-containing
SiN film/SiN layer containing O and C

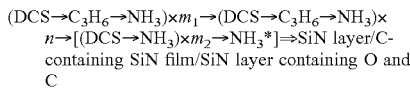
(DCS→C₃H₆→NH₃)×m₁→(DCS→C₃H₆→NH₃)×
n→[(DCS→NH₃)×m₂→NH₃*]⇒SiN layer/C-
containing SiN film/SiN layer containing O and
C

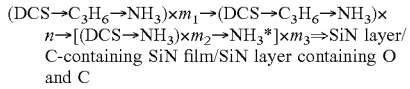
(DCS→C₃H₆→NH₃)×m₁→(DCS→C₃H₆→NH₃)×
n→[(DCS→NH₃)×m₂→NH₃*]×m₃⇒SiN layer/
C-containing SiN film/SiN layer containing O
and C Second Embodiment A second embodiment of the present disclosure will now be mainly described with reference to FIGS. 13A to 13C.

This embodiment is different from the aforementioned embodiment, in that a concave portion is formed on a surface of the wafer 200 and the wafer 200 in which an oxide film such as an SiO film or the like is formed on an inner surface of the concave portion is processed. At a pre-processing step, an SiN layer containing O and C is formed as a seed layer on the inner surface of the concave portion in which the SiO film is formed. Furthermore, at a protective film forming step, an SiN film containing C as a protective film is formed to fill the interior of the concave portion in which the seed layer is formed. Thereafter, the wafer 200 is subjected to a heating process under a temperature condition higher than a temperature of the wafer 200 at the protective film forming step. Hereinafter, the second embodiment will be described in detail with a focus on differences from the aforementioned embodiment.

Figure 13A:
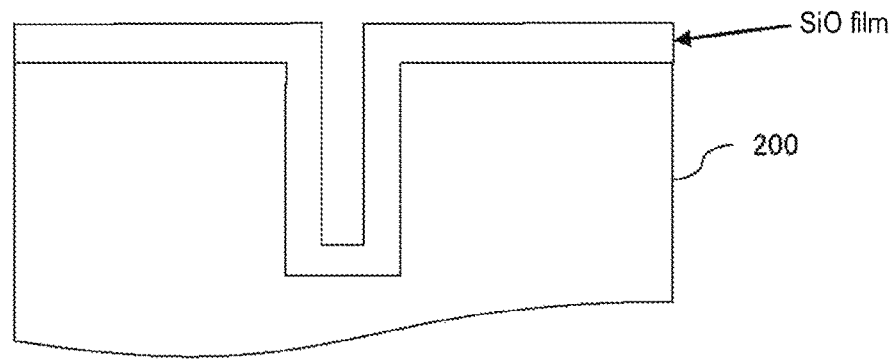
FIG. 13A is a view illustrating a cross sectional structure of a substrate to be processed.

FIG. 13A illustrates a cross sectional structure of the wafer 200 before the film forming process. For example, a concave portion having, for example, a cylinder structure, a trench structure or the like is formed on the surface of the wafer 200. For example, an aspect ratio of the concave portion, namely a ratio of a depth to an inner diameter of the concave portion (depth/inner diameter) is about 5 to 100. Furthermore, an SiO film is formed on the surface of the wafer 200 including the inner surface of the concave portion. The SiO film may be a film to be protected by the C-containing SiN film, at an etching process which will be performed later.

A seed layer (SiN layer containing O and C) and a protective film (C-containing SiN film) are sequentially formed on the SiO film of the wafer 200 configured as described above. For example, the formation of the seed layer and the protective film may be performed using the substrate-processing apparatus illustrated in FIG. 1 and under the same procedures and process conditions as those of the film forming sequence illustrated in FIG. 4 or as those of the respective modifications described above. Even in this embodiment, similar to the aforementioned embodiment, the pre-processing step may be omitted.

Figure 13B:
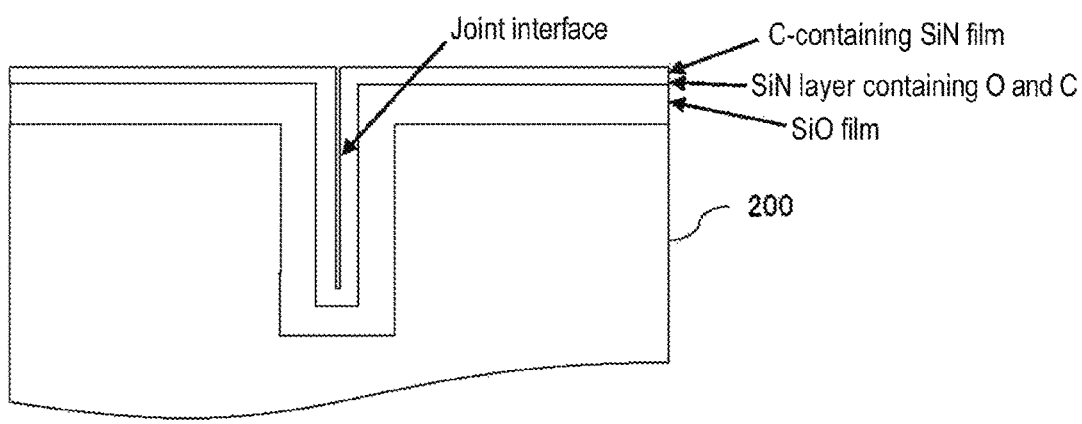
FIG. 13B is a view illustrating a cross sectional structure of a substrate after a film forming process.

FIG. 13B illustrates a cross sectional structure of the wafer 200 after the formation of the C-containing SiN film. The C-containing SiN film is formed to fill the interior of the concave portion while continuously covering the surface of the SiO film. As mentioned above, since the supply of the DCS gas to the wafer 200, the supply of the C₃H₆ gas to the wafer 200, and the supply of the NH₃ gas to the wafer 200 are non-simultaneously performed in the film forming process, it is possible to form the C-containing SiN film within the concave portion with good step coatability.

However, at this stage, an interface structure extending in a depth direction may be often present within the concave portion. That is to say, the C-containing SiN films grown from facing surfaces of the inner walls of the concave portion are close to or make contact with each other in the respective surfaces, but at least a portion of the respective surfaces may not join each other. Hereinafter, the non-junction portion of the C-containing SiN film within the concave portion may be referred to as a "joint interface". In the case where the concave portion has a cylinder structure, a joint interface formed within the concave portion may have, for example, a fine hole shape extending in a depth direction of the concave portion. Furthermore, in the case where the concave portion has a trench structure, a joint interface formed within the concave portion may have, for example, a crevasse shape extending in a depth direction of the concave portion. The joint interface may act as a path through which an etchant enters toward the SiO film side, i.e., as a pin hole, in the subsequent etching process. The joint interface is easily generated as the aspect ratio of the concave portion is increased, specifically, 5 or more, for example, 20 or more, ultimately 50 or more.

Thus, in this embodiment, in order to eliminate the joint interface, the wafer 200 on which the C-containing SiN film is formed is subjected to the heating process (annealing process). The heating process is performed under a temperature condition higher than the temperature of the wafer 200 at the protective film forming step. The heating process may be performed using the substrate-processing apparatus illustrated in FIG. 1.

Specifically, after the C-containing SiN film is formed on the wafer 200, the interior of the process chamber 201 is exhausted by the same process procedures as those of the purge step of the aforementioned embodiment. Then, an N₂ gas, which is an inert gas serving as an annealing gas, is supplied into the process chamber 201, and the interior of the process chamber 201 is substituted with an atmosphere of the N₂ gas. At this time, the N₂ gas is supplied using at least one or both of the gas supply pipes 232d and 232e. Then, the APC valve 244 is controlled such that the interior of the process chamber 201 has a desired process pressure. Furthermore, the heater 207 is controlled such that the temperature (heating process temperature) of the wafer 200 becomes a predetermined process temperature higher than the temperature (film formation temperature) of the wafer 200 at the protective film forming step. The interior of the process chamber 201 is substituted with the $N_2$ gas atmosphere having a desired process pressure and the temperature of the wafer 200 becomes equal to the desired process temperature. This state is maintained for a predetermined period of time. Furthermore, in the case where the heating process temperature is set at a temperature lower than the film formation temperature, for example, 300 to 650 degrees C., it may be difficult for C to be desorbed from the C-containing SiN film. This makes it difficult to eliminate the joint interface formed within the concave portion for the reason described later.

The process conditions of the heating process are illustrated as follows.

Heating process temperature: 700 to 800 degrees C.
Process pressure: atmospheric pressure
Flow rate of the annealing gas ($N_2$ gas): 100 to 10,000 sccm
Process time: 30 to 180 min.

Figure 13C:
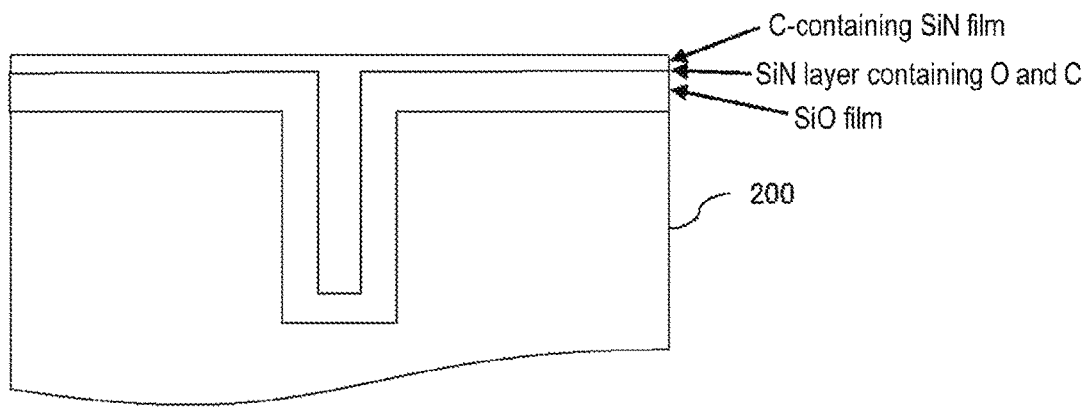
FIG. 13C is a view illustrating a cross sectional structure of a substrate after a heating process.

By performing the heating process under the aforementioned conditions, it becomes possible to unite the C-containing SiN films formed within the concave portion and to eliminate the joint interface, as illustrated in FIG. 13C. That is to say, it becomes possible to integrally join the surfaces of the C-containing SiN films grown from the mutually facing surfaces of the inner walls of the concave portion with no gap. As a result, the interior of the concave portion is uniformly embedded by the C-containing SiN film. Furthermore, the aforementioned joining appropriately uses a phenomenon that C is desorbed from the surface of the C-containing SiN film through the heating process. The reason is because, when C is desorbed from the surface of the C-containing SiN film by performing the heating process, Si which was bonded to C has a dangling bond. Further, the aforementioned joining is promoted as Si having the dangling bond and another Si having the dangling bond are bonded (by forming an Si—Si bond). In this regard, in the case where a protective film is formed of an SiN film not containing C, it is impossible to use the desorption reaction of C described above. Accordingly, it is difficult to eliminate the joint interface even though the process temperature is set at a temperature higher than the aforementioned temperature range.

As the annealing gas, it may be possible to use, in addition to the $N_2$ gas, a rare gas such as an Ar gas, a He gas, a Ne gas, a Xe gas or the like, or an $H_2$ gas. As the annealing gas, it also may be possible to use an O-containing gas such as an $O_2$ gas. In these cases, the annealing gas may be supplied from any of the gas supply pipes 232a to 232e. The process conditions may be similar to the aforementioned conditions.

Furthermore, in the case of using an O-containing gas as the annealing gas, a gaseous substance such as, for example, $CO_2$ or the like is generated due to a reaction between C contained in the C-containing SiN film and the O-containing gas, making it possible to promote the desorption of C from the C-containing SiN film. As a result, it becomes possible to finely adjust a concentration of C in the C-containing SiN film. Moreover, by desorbing C from the C-containing SiN film, it becomes possible to reliably eliminate the joint interface formed within the concave portion. As the O-containing gas, it may be possible to use, in addition to the $O_2$ gas, a nitrous oxide ($N_2O$) gas, a nitrogen monoxide (NO) gas, a nitrogen dioxide ($NO_2$) gas, an $O_3$ gas, an $H_2$ gas+$O_2$ gas, an $H_2$ gas+$O_3$ gas, water vapor ($H_2O$ gas), a carbon monoxide (CO) gas, a carbon dioxide ($CO_2$) gas or the like.

When the joint interface is eliminated, the wafer 200 which has been subjected to the heating process is unloaded from the interior of the process chamber 201. Then, similar to the aforementioned embodiment, an additional film forming process, additional resist pattern forming process and the like are performed on the wafer 200 which has been subjected to the heating process. Then, the etching process is performed on the thin film or the like formed on the surface of the wafer 200 according to the same process procedures and process conditions as those of the aforementioned embodiment. At this time, the C-containing SiN film, which has been subjected to the heating process, formed on the wafer 200, functions as a protective film to protect the underlying SiO film.

Even in this embodiment, the same effects as those of the aforementioned embodiment may be achieved. Furthermore, in the case where the concave portion of the surface of the wafer 200 is embedded by the protective film, the joint interface generated in the protective film can be eliminated by the heating process. In particular, by forming the C-containing SiN film as a protective film, it becomes possible to more reliably eliminate the joint interface. Accordingly, it becomes possible to form a protective film with a smooth surface. In addition, by eliminating the joint interface, it becomes possible to suppress an etchant from reaching an underlying film through the joint interface when performing the etching process, and to more reliably reduce an etching damage to the underlying film. Moreover, it becomes possible to prevent an etchant from entering the joint interface and to further suppress the etching of the protective film itself. Thus, it is possible to more reliably avoid a degradation of the function as the protective film. Furthermore, it was confirmed that the same effects as the aforementioned effects based on the heating process may be achieved even when an aspect ratio of the concave portion is 5 or more, for example, 20 or more, ultimately 50 or more. As mentioned above, the joint interface is easily generated as the aspect ratio of the concave portion is increased. Thus, the heating process of this embodiment is meaningful particularly when the concave portion having such a high aspect ratio as described above is embedded by the protective film.

Other Embodiments

While some embodiments of the present disclosure have been specifically described above, the present disclosure is not limited to the aforementioned embodiments but may be differently modified without departing from the spirit of the present disclosure.

For example, in the aforementioned embodiments, the process procedures and the process conditions are the same at the pre-processing step and the protective film forming step, except for the number of times of performing a cycle, but these may be different. For example, at the pre-processing step and the protective film forming step, the order of supplying gases may be different. Furthermore, for example, at the pre-processing step and the protective film forming step, the type of the precursor gas may be different, the type of the C-containing gas may be different, or the type of the N-containing gas may be different. In addition, for example, at the pre-processing step and the protective film forming step, the process conditions such as the temperature of the wafer 200, the internal pressure of the process chamber 201, and the supply flow rate or the supply time of each gas may be different.

Moreover, for example, the C-containing SiN film formed as a protective film may be a film further containing at least one of O and boron (B). That is to say, either the C-containing SiON film or C-containing SiBN film, rather than the C-containing SiN film, may be formed as a protective film.

In other words, a film may further contain O or B as long as it contains three elements of Si, C, and N as a protective film. Also, a laminated film obtained by laminating two or more types of the C-containing SiN film, the C-containing SiON film, and the C-containing SiBN film in any combination may be formed as a protective film. The C-containing SiON film may also be referred to as an SiN film containing C and O, and the C-containing SiBN film may also be referred to as an SiN film containing C and B.

In order to form the C-containing SiON film, when performing the aforementioned cycle, a step of supplying, for example, an $O_2$ gas as an O-containing gas into the process chamber 201 may be performed non-simultaneously with steps 1 to 3. The $O_2$ gas may be supplied from the gas supply pipe 232b. The supply flow rate of the $O_2$ gas controlled by the MFC 241b may be set at a flow rate which falls within a range of, for example, 100 to 10,000 sccm. Other process procedures and process conditions may be similar to, for example, those of the film forming sequence described above with reference to FIG. 4. As the O-containing gas, for example, it may be possible to use, in addition to the $O_2$ gas, an $N_2O$ gas, an NO gas, an $NO_2$ gas, an $O_3$ gas, an $H_2$ gas+$O_2$ gas, an $H_2$ gas+$O_3$ gas, an $H_2O$ gas, a CO gas, a $CO_2$ gas or the like.

In order to form the C-containing SiBN film, when performing the aforementioned cycle, a step of supplying, for example, a trichloroborane ($BCl_3$) gas as a B-containing gas into the process chamber 201 may be performed non-simultaneously with steps 1 to 3. The $BCl_3$ gas may be supplied from the gas supply pipe 232b. The supply flow rate of the $BCl_3$ gas controlled by the MFC 241b may be set at a flow rate which falls within a range of, for example, 100 to 10,000 sccm. Other process procedures and process conditions may be similar to, for example, those of the film forming sequence described above with reference to FIG. 4. As the B-containing gas, it may be possible to use, in addition to the $BCl_3$ gas, a monochloroborane ($BClH_2$) gas, a dichloroborane ($BCl_2H$) gas, a trifluoroborane ($BF_3$) gas, a tribromoborane ($BBr_3$) gas, a diborane ($B_2H_6$) gas or the like.

The present disclosure may be appropriately applied to a case where a nitride film containing C and a metal element such as titanium (Ti), zirconium (Zr), hafnium (Hf), taltanum (Ta), niobium (Nb), molybdenum (Mo), tungsten (W), yttrium (Y), strontium (Sr), aluminum (Al) or the like, namely a metal nitride film containing C, are formed on the wafer 200. That is to say, the present disclosure may be applied to a case where, for example, a TiN film containing C, a ZrN film containing C, an HfN film containing C, a TaN film containing C, a NbN film containing C, a MoN film containing C, a WN film containing C, a YN film containing C, an SrN film containing C, or an AN film containing C is formed on the wafer 200.

For example, the present disclosure may be appropriately applied to a case where a metal compound gas (metal precursor) containing the aforementioned metal elements is used as a precursor, and a seed layer (a metal nitride layer containing O and C) and a C-containing metal nitride film are sequentially formed on an oxide film formed on the surface of the wafer 200 according to a film forming sequence illustrated later.

(Metal precursor→$C_3H_6$→$NH_3$)×m→(Metal
 precursor→$C_3H_6$→$NH_3$)×n⇒C-containing
 metal nitride film/metal nitride layer containing
 O and C (Metal precursor→NH3*)×m→(Metal
 precursor→$C_3H_6$→$NH_3$)×n⇒C-containing
 metal nitride film/metal nitride layer

[(Metal precursor→$NH_3$)×m→$NH_3$*]→(Metal
 precursor→$C_3H_6$→$NH_3$)×n⇒C-containing
 metal nitride film/metal nitride layer

[(Metal precursor→$NH_3$)×$m_1$→$NH_3$]×$m_2$→(Metal
 precursor→$C_3H_6$→$NH_3$)×n⇒C-containing
 metal nitride film/metal nitride layer Furthermore, similar to the aforementioned modifications, a cap layer (metal nitride layer) may be formed on the surface of the C-containing metal nitride film.

That is to say, the present disclosure may be appropriately applied to a case where a C-containing semiconductor nitride film or a C-containing metal nitride film is formed. Process procedures and process conditions of this film forming process may be similar to the process procedures and process conditions of the embodiments or the modifications described above. Even in this case, the same effects as those of the embodiments or the modifications described above may be achieved.

Recipes (programs describing process procedures and process conditions) used in substrate process may be prepared individually according to processing contents (the kind, composition ratio, quality, film thickness, process procedure and process condition of a film to be formed) and may be stored in the memory device 121c via a telecommunication line or the external memory device 123. Moreover, at the start of the substrate process, the CPU 121a may properly select an appropriate recipe from the recipes stored in the memory device 121c according to the processing contents. Thus, it is possible for a single substrate-processing apparatus to form films of different kinds, composition ratios, qualities and thicknesses with enhanced reproducibility. In addition, it is possible to reduce an operator's burden (e.g., a burden borne by an operator when inputting process procedures and process conditions) and to quickly start the substrate process while avoiding an operation error.

The recipes mentioned above are not limited to newly-prepared ones but may be prepared by, for example, modifying the existing recipes already installed in the substrate-processing apparatus. When modifying the recipes, the modified recipes may be installed in the substrate-processing apparatus via a telecommunication line or a recording medium storing the recipes. In addition, the existing recipes already installed in the substrate-processing apparatus may be directly modified by operating the input/output device 122 of the existing substrate-processing apparatus.

In the aforementioned embodiments, there has been described an example in which films are formed using a batch-type substrate-processing apparatus capable of processing a plurality of substrates at a time. The present disclosure is not limited to the aforementioned embodiment but may be appropriately applied to, e.g., a case where films are formed using a single-wafer-type substrate-processing apparatus capable of processing a single substrate or several substrates at a time. In addition, in the aforementioned embodiments, there has been described an example in which films are formed using a substrate-processing apparatus provided with a hot-wall-type process furnace. The present disclosure is not limited to the aforementioned embodiments but may be appropriately applied to a case where films are formed using a substrate-processing apparatus provided with a cold-wall-type process furnace. Even in these cases, process procedures and the process conditions may be similar to, for example, the process procedures and the process conditions of the aforementioned embodiments.

Figure 15:
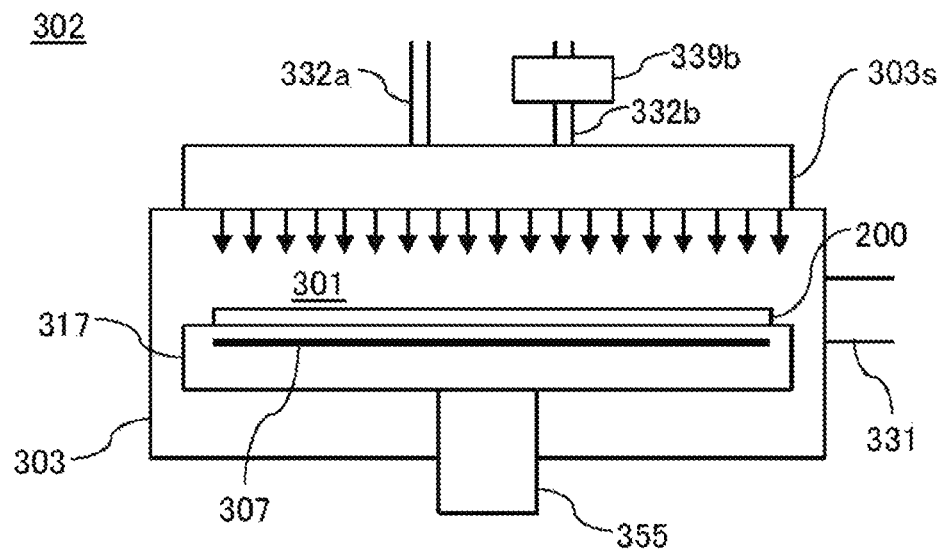
FIG. 15 is a schematic configuration diagram of a process furnace of a substrate-processing apparatus suitably used in another embodiment of the present disclosure, in which the portion of the process furnace is shown in a vertical cross sectional view.

The present disclosure may be suitably applied to, e.g., a case where films are formed using a substrate-processing apparatus provided with a process furnace 302 illustrated in FIG. 15. The process furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A gas supply system similar to the first supply system of the aforementioned embodiment is connected to the gas supply port 332a. A remote plasma unit (plasma generation device) 339b as an excitation part for plasma-exciting and supplying a gas and a gas supply system similar to the second and third supply systems of the aforementioned embodiment are connected to the gas supply port 332b. A gas distribution plate configured to supply a gas into the process chamber 301 in a shower-like manner is installed in outlets (gas discharge holes) of the shower head 303s. The shower head 303s is installed at such a position as to face the surfaces of the wafers 200 carried into the process chamber 301. An exhaust port 331 configured to exhaust the interior of the process chamber 301 is installed in the process vessel 303. An exhaust system similar to the exhaust system of the aforementioned embodiment is connected to the exhaust port 331.

Figure 16:
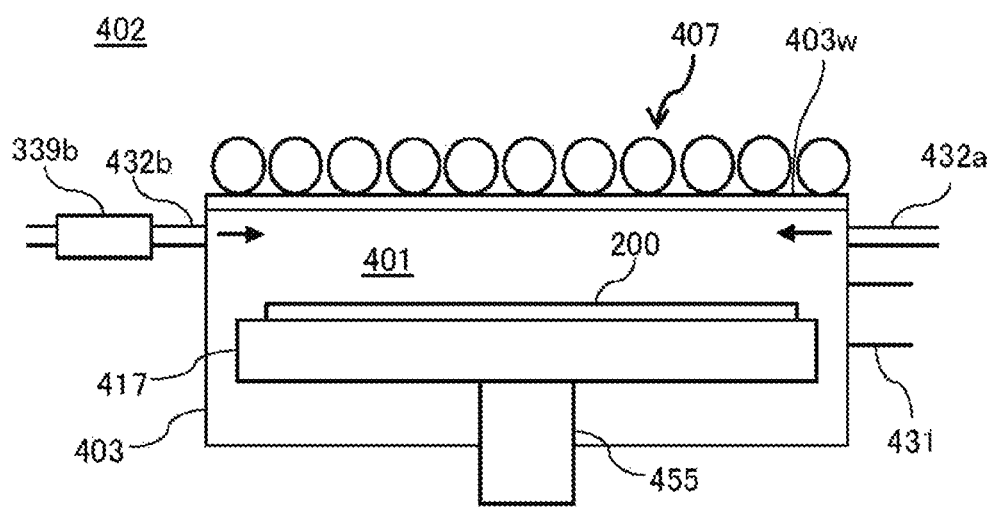
FIG. 16 is a schematic configuration diagram of a process furnace of a substrate-processing apparatus suitably used in another embodiment of the present disclosure, in which the portion of the process furnace is shown in a vertical cross sectional view.

In addition, the present disclosure may be suitably applied to, e.g., a case where films are formed using a substrate-processing apparatus provided with a process furnace 402 illustrated in FIG. 16. The process furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. A supply system similar to the first supply system of the aforementioned embodiment is connected to the gas supply port 432a. The aforementioned remote plasma unit 339b and a supply system similar to the second and third supply systems of the aforementioned embodiment are connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 401. An exhaust port 431 configured to exhaust the interior of the process chamber 401 is installed in the process vessel 403. An exhaust system similar to the exhaust system of the aforementioned embodiment is connected to the exhaust port 431.

The aforementioned annealing process may be performed using a first substrate processing part for performing the film forming process or a second substrate processing part for performing the etching process, or using a third substrate processing part, namely a dedicated annealing device different from the first and second substrate processing parts. Furthermore, such substrate processing parts are not limited to a case of being configured as a dependent device (stand-alone type device) group but may also be configured as a single device (cluster type device) mounted on the same platform.

Even in the case of using the aforementioned substrate-processing apparatuses, the film forming process may be performed in the same process procedures and process conditions as those of the embodiments and modifications described above. Thus, the same effects as those of the embodiments and modifications described above may be achieved.

The embodiments and modifications described above may be appropriately combined with one another. Process procedures and process conditions used at this time may be similar to, for example, the process procedures and process conditions of the aforementioned embodiment.

Examples

In an example, the substrate-processing apparatus of the aforementioned embodiments was used and a seed layer (an SiN layer containing O and C) and a protective film (C-containing SiN film) were sequentially formed on a wafer on which an SiO film having a film thickness of about 1,000 Å is formed on a surface of the wafer according to the film forming sequence illustrated in FIG. 4. A DCS gas was used as a precursor gas, an $NH_3$ gas was used as an N-containing gas, and a $C_3H_6$ gas was used as a C-containing gas. As the process conditions, conditions within the process conditions described in the aforementioned embodiments were used. Furthermore, before performing the film forming process, a film thickness A of the SiO film was measured in advance from 49 places in-plane of the wafer. In addition, after the protective film was formed, a film thickness B of a laminated film in which the SiO film, the seed layer, and the protective film were laminated (hereinafter, also referred to as a laminated film in which the SiO film and the protective film are laminated for the sake of convenience) was measured. Measurement points of the film thickness B were identical to those of the film thickness A. In addition, about 30 Å of a difference between the film thickness A and the film thickness B is a thickness of the sum of the seed layer and the protective film.

Further, in a comparative example, the substrate-processing apparatus of the aforementioned embodiments was used, and an SiN film not containing C was formed as a protective film on a wafer on which an SiO film having a film thickness of about 1,000 Å is formed. The formation of the SiN film was performed according to a film forming sequence of implementing, a predetermined number of times, a cycle of non-simultaneously performing a step of supplying a precursor gas to the wafer in the process chamber and a step of supplying an N-containing gas to the wafer in the process chamber. A DCS gas was used as a precursor gas and an $NH_3$ gas was used as an N-containing gas. As the process conditions, conditions within the process conditions described in the aforementioned embodiments were used. Furthermore, before performing the film forming process, like the above Example, a film thickness A of the SiO film was measured in advance from 49 places in-plane of the wafer. Further, after the protective film was formed, similar to the above Example, a film thickness B of a laminated film in which the seed layer and the protective film were laminated was measured. Measurement points of the film thickness B were similar to those of the film thickness A. In addition, about 30 Å of a difference between the film thickness A and the film thickness B is a thickness of the sum of the seed layer and the protective film.

Furthermore, regarding respective samples of the above Example and the comparative example, an etching process of supplying a 1% of HF solution on the surface of the wafer was performed. Thereafter, regarding the respective samples of the above Example and the comparative example, film thicknesses B' of the laminated films in which the SiO film and the protective film were laminated were measured. Measurement points of the film thickness B' were similar to those of the film thicknesses A and B.

FIG. 14A is a diagram illustrating an evaluation result of etching tolerance of a protective film in the above Example and FIG. 14B a diagram illustrating an evaluation result of etching tolerance of a protective film in the comparative example. In either of the drawings, the vertical axis represents a film thickness [Å] and the horizontal axis represents measurement places of a film thickness. Further, in the drawings, the solid lines represent a film thickness A of the SiO film and the two point chain lines represent a film thickness B of a laminated film before the etching process is performed, and the dotted lines represent a film thickness B' of the laminated film after the etching process is performed.

As illustrated in FIG. 14A, it can be seen that, in the above Example, the film thickness of the laminated film is not mostly changed before and after the etching process. Specifically, it can be seen that an etched amount of the C-containing SiN film constituting a protective film is less than 2 Å over the entire surface of the wafer and the underlying SiO film is protected without being etched over the entire surface of the wafer. In contrast, as illustrated in FIG. 14B, in the comparative example, it can be seen that the film thickness of the laminated film is significantly changed before and after the etching process. Specifically, it can be seen that the SiN film not containing C constituting a protective film is etched and mostly eliminated over the entire surface of the wafer, and the underlying SiO film is partially etched to reduce the film thickness.

In this sense, it can be seen that, by forming the SiN layer containing O and C as a seed layer before the formation of a protective film and adding C to the SiN film constituting the protective film, it is possible to suppress the degradation of a function as the protective layer and to sufficiently protect the underlying SiO film. In addition, it can be seen that, by setting a film thickness of the C-containing SiN film to become 2 Å or more, it is possible to sufficiently protect the underlying SiO film. Moreover, it can be seen that, by setting a film thickness of the C-containing SiN film to become 5 Å or more, specifically 10 Å or more, it is possible to reliably protect the underlying SiO film even when there is a variation in the etched amount of the C-containing SiN film. Further, the present inventors confirmed that, by setting a film thickness of the C-containing SiN film to become 20 Å or more, specifically 30 Å or more, it is possible to further increase the number of Si—C bonds included in the film, to further enhance the function of the film as the protective film, and to more reliably protect the underlying SiO film.

What is claimed is:

1. A method for manufacturing a semiconductor device, comprising:
    preparing a substrate with an oxide film formed on a surface of the substrate;
    performing a pre-processing to form a nitride layer containing oxygen and carbon on a surface of the oxide film by using the oxide film as an oxygen source, and by performing a cycle a predetermined number of times, the cycle including non-simultaneously performing:
    supplying a precursor gas to the substrate;
    supplying a carbon-containing gas to the substrate; and
    supplying a nitrogen-containing gas to the substrate, or by performing a cycle a predetermined number of times, the cycle including non-simultaneously performing:
    supplying a precursor gas to the substrate; and
    supplying a gas containing carbon and nitrogen to the substrate, or
    by performing a cycle a predetermined number of times, the cycle including non-simultaneously performing:
    supplying a precursor gas containing carbon to the substrate; and
    supplying a nitrogen-containing gas to the substrate; and
    forming a nitride film containing carbon on the surface of the oxide film on which the pre-processing has been performed, by performing a cycle a predetermined number of times, the cycle including non-simultaneously performing:
    supplying a precursor gas to the substrate;
    supplying a carbon-containing gas to the substrate; and
    supplying a nitrogen-containing gas to the substrate, or by performing a cycle a predetermined number of times, the cycle including non-simultaneously performing:
    supplying a precursor gas to the substrate; and
    supplying a gas containing carbon and nitrogen to the substrate, or
    by performing a cycle a predetermined number of times, the cycle including non-simultaneously performing:
    supplying a precursor gas containing carbon to the substrate; and
    supplying a nitrogen-containing gas to the substrate.

2. The method of claim 1, wherein the act of performing the pre-processing and the act of forming the nitride film containing carbon are performed in a state where the substrate is accommodated in a process chamber, and
    wherein the method further comprises forming a cap layer on a surface of the nitride film containing carbon in the same process chamber, after the act of forming the nitride film containing carbon.

3. The method of claim 1, wherein a thickness of the nitride film containing carbon is equal to or greater than 0.2 nm, and is equal to or smaller than 10 nm.

4. The method of claim 1, wherein a concentration of carbon in the nitride film containing carbon is equal to or higher than 3 atomic %, and is equal to or lower than 10 atomic %.

5. The method of claim 1, wherein the method further comprises performing an etching process to the substrate on which the nitride film containing carbon is formed.

6. The method of claim 1, wherein a thickness of the nitride film containing carbon is equal to or greater than 0.5 nm, and is equal to or smaller than 10 nm.

7. The method of claim 1, wherein a thickness of the nitride film containing carbon is equal to or greater than 1 nm, and is equal to or smaller than 10 nm.

8. The method of claim 1, wherein a concentration of carbon in the nitride film containing carbon is equal to or higher than 5 atomic %, and is equal to or lower than 9 atomic %.

9. The method of claim 1, wherein a concentration of carbon in the nitride film containing carbon is equal to or higher than 7 atomic %, and is equal to or lower than 8 atomic %.

10. The method of claim 1, wherein a concave portion is formed on the surface of the substrate, and the oxide film is formed on an inner surface of the concave portion, wherein, in the act of forming the nitride film containing carbon, the nitride film containing carbon is formed to fill an interior of the concave portion on which the oxide film is formed, wherein the method further comprises after the act of forming the nitride film containing carbon, heat-processing the substrate under a temperature higher than a temperature of the substrate in the act of forming the nitride film containing carbon, and wherein the act of performing the pre-processing and the act of forming the nitride film containing carbon are performed in a state where the substrate is accommodated in a process chamber.

11. The method of claim 10, wherein, in the act of heat-processing, a portion of carbon is desorbed from the nitride film containing carbon.

12. The method of claim 10, wherein, in the act of heat-processing, the nitride film containing carbon formed in the interior of the concave portion is joined with no gap.

13. The method of claim 10, an aspect ratio of the concave portion is equal to or greater than 5, and is equal to or less than 100.

14. A substrate-processing apparatus, comprising:
a process chamber in which a substrate is processed;
a supply system configured to supply gases to the substrate in the process chamber; and
a controller configured to control the supply system so as to:
after the substrate with an oxide film formed on a surface of the substrate is prepared in the process chamber, perform a pre-processing to form a nitride layer containing oxygen and carbon on a surface of the oxide film by using the oxide film as an oxygen source, and by performing a cycle a predetermined number of times, the cycle including non-simultaneously performing:
supplying a precursor gas to the substrate;
supplying a carbon-containing gas to the substrate; and
supplying a nitrogen-containing gas to the substrate, or
by performing a cycle a predetermined number of times, the cycle including non-simultaneously performing:
supplying a precursor gas to the substrate; and
supplying a gas containing carbon and nitrogen to the substrate, or
by performing a cycle a predetermined number of times, the cycle including non-simultaneously performing:
supplying a precursor gas containing carbon to the substrate; and
supplying a nitrogen-containing gas to the substrate; and
form a nitride film containing carbon on the surface of the oxide film on which the pre-processing has been performed, by performing a cycle a predetermined number of times, the cycle including non-simultaneously performing:
supplying a precursor gas to the substrate;
supplying a carbon-containing gas to the substrate; and
supplying a nitrogen-containing gas to the substrate, or
by performing a cycle a predetermined number of times, the cycle including non-simultaneously performing:
supplying a precursor gas to the substrate; and
supplying a gas containing carbon and nitrogen to the substrate, or by performing a cycle a predetermined number of times, the cycle including non-simultaneously performing:
supplying a precursor gas containing carbon to the substrate; and
supplying a nitrogen-containing gas to the substrate.

15. A non-transitory computer-readable recording medium storing a program that causes a computer to perform a process, the process comprising:
preparing a substrate with an oxide film formed on a surface of the substrate;
performing a pre-processing to form a nitride layer containing oxygen and carbon on a surface of the oxide film by using the oxide film as an oxygen source, and by performing a cycle a predetermined number of times, the cycle including non-simultaneously performing:
supplying a precursor gas to the substrate;
supplying a carbon-containing gas to the substrate; and
supplying a nitrogen-containing gas to the substrate, or
by performing a cycle a predetermined number of times, the cycle including non-simultaneously performing:
supplying a precursor gas to the substrate; and
supplying a gas containing carbon and nitrogen to the substrate, or
by performing a cycle a predetermined number of times, the cycle including non-simultaneously performing:
supplying a precursor gas containing carbon to the substrate; and
supplying a nitrogen-containing gas to the substrate; and
forming a nitride film containing carbon on the surface of the oxide film on which the pre-processing has been performed, by performing a cycle a predetermined number of times, the cycle including non-simultaneously performing:
supplying a precursor gas to the substrate;
supplying a carbon-containing gas to the substrate; and
supplying a nitrogen-containing gas to the substrate, or by performing a cycle a predetermined number of times, the cycle including non-simultaneously performing:
supplying a precursor gas to the substrate; and
supplying a gas containing carbon and nitrogen to the substrate, or
by performing a cycle a predetermined number of times, the cycle including non-simultaneously performing:
supplying a precursor gas containing carbon to the substrate; and
supplying a nitrogen-containing gas to the substrate.

* * * * *